United States Patent
Ebisuno et al.

(10) Patent No.: US 10,482,814 B2
(45) Date of Patent: Nov. 19, 2019

(54) DISPLAY DEVICE AND METHOD FOR DRIVING SAME

(71) Applicant: JOLED INC., Tokyo (JP)

(72) Inventors: Kohei Ebisuno, Tokyo (JP); Shinya Ono, Osaka (JP); Masafumi Matsui, Tokyo (JP)

(73) Assignee: JOLED INC., Tokyo (JP)

( * ) Notice: Subject to any disclaimer, the term of this patent is extended or adjusted under 35 U.S.C. 154(b) by 76 days.

(21) Appl. No.: 15/504,987

(22) PCT Filed: Jul. 31, 2015

(86) PCT No.: PCT/JP2015/003887
§ 371 (c)(1),
(2) Date: Feb. 17, 2017

(87) PCT Pub. No.: WO2016/027425
PCT Pub. Date: Feb. 25, 2016

(65) Prior Publication Data
US 2017/0270856 A1 Sep. 21, 2017

(30) Foreign Application Priority Data
Aug. 20, 2014 (JP) .................. 2014-167919

(51) Int. Cl.
*G09G 3/3233* (2016.01)
*H01L 27/32* (2006.01)

(52) U.S. Cl.
CPC ....... *G09G 3/3233* (2013.01); *H01L 27/3262* (2013.01); *H01L 27/3265* (2013.01);
(Continued)

(58) Field of Classification Search
CPC ..... G09G 3/3233; G09G 3/3258; G09G 3/006
(Continued)

(56) References Cited

U.S. PATENT DOCUMENTS

| 8,907,876 | B2 * | 12/2014 | Hasumi | G09G 3/3233 |
| | | | | 345/211 |
| 9,697,772 | B2 * | 7/2017 | Osame | G09G 3/3233 |

(Continued)

FOREIGN PATENT DOCUMENTS

| JP | 2009-168969 | 7/2009 |
| JP | 2009-204887 | 9/2009 |
| JP | 2010-25967 | 2/2010 |

OTHER PUBLICATIONS

Search Report issued in International Patent Application No. PCT/JP2015/003887, dated Oct. 27, 2015.

*Primary Examiner* — Fred Tzeng
(74) *Attorney, Agent, or Firm* — Greenblum & Bernstein, P.L.C.

(57) ABSTRACT

A method for driving a display device including a plurality of pixels arranged in rows and columns, each of the pixels including an organic EL device that emits light in accordance with supplied current, a driving transistor that supplies current to the organic EL device, and a storage capacitor connected between the gate of driving transistor and a source or drain thereof, includes causing the organic EL device to emit light by supplying current to the organic EL device; resetting charge of at least one of the storage capacitor and a parasitic capacitance of the organic EL device; and applying a reverse bias voltage between the gate and source of the driving transistor. The resetting is performed between the light emission and the reverse-bias application.

16 Claims, 18 Drawing Sheets

(52) U.S. Cl.
CPC . *H01L 27/3276* (2013.01); *G09G 2300/0842* (2013.01); *G09G 2300/0866* (2013.01); *G09G 2310/0251* (2013.01); *G09G 2310/0254* (2013.01); *G09G 2310/08* (2013.01); *G09G 2320/0271* (2013.01); *G09G 2320/043* (2013.01); *G09G 2320/045* (2013.01); *G09G 2320/0626* (2013.01)

(58) Field of Classification Search
USPC .......................................................... 345/690
See application file for complete search history.

(56) References Cited

U.S. PATENT DOCUMENTS

| | | | |
|---|---|---|---|
| 9,799,246 B2* | 10/2017 | Chaji | .................... G09G 3/006 |
| 2003/0160745 A1* | 8/2003 | Osame | ................. G09G 3/3258 |
| | | | 345/82 |
| 2009/0179838 A1 | 7/2009 | Yamashita et al. | |
| 2009/0219231 A1 | 9/2009 | Yamamoto et al. | |
| 2010/0013746 A1 | 1/2010 | Seto | |
| 2014/0225883 A1* | 8/2014 | Chaji | .................. G09G 3/3258 |
| | | | 345/212 |
| 2014/0285407 A1* | 9/2014 | Chaji | .................. G09G 3/3233 |
| | | | 345/76 |
| 2014/0340432 A1* | 11/2014 | Chaji | .................. G09G 3/3233 |
| | | | 345/690 |

\* cited by examiner

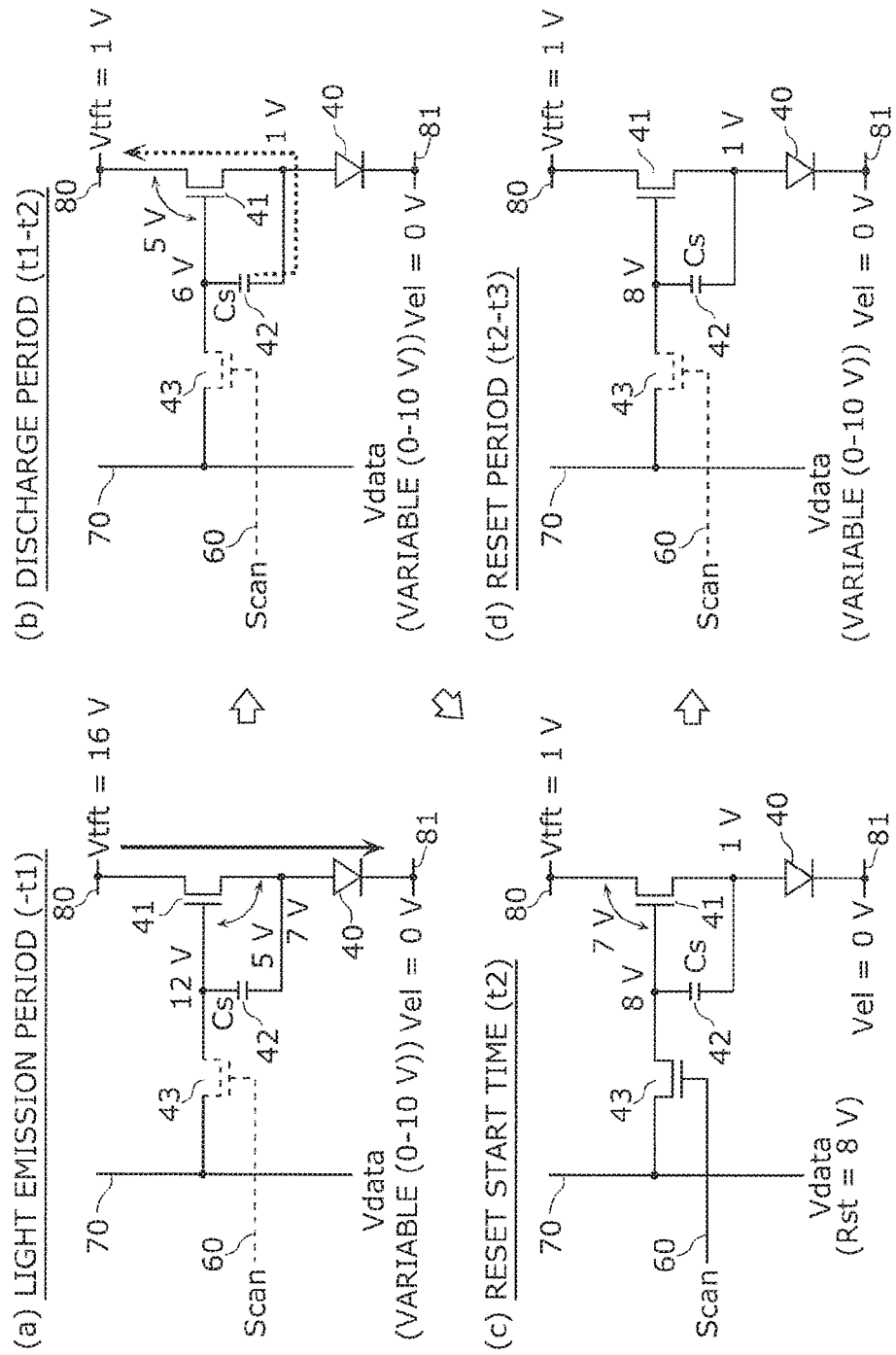

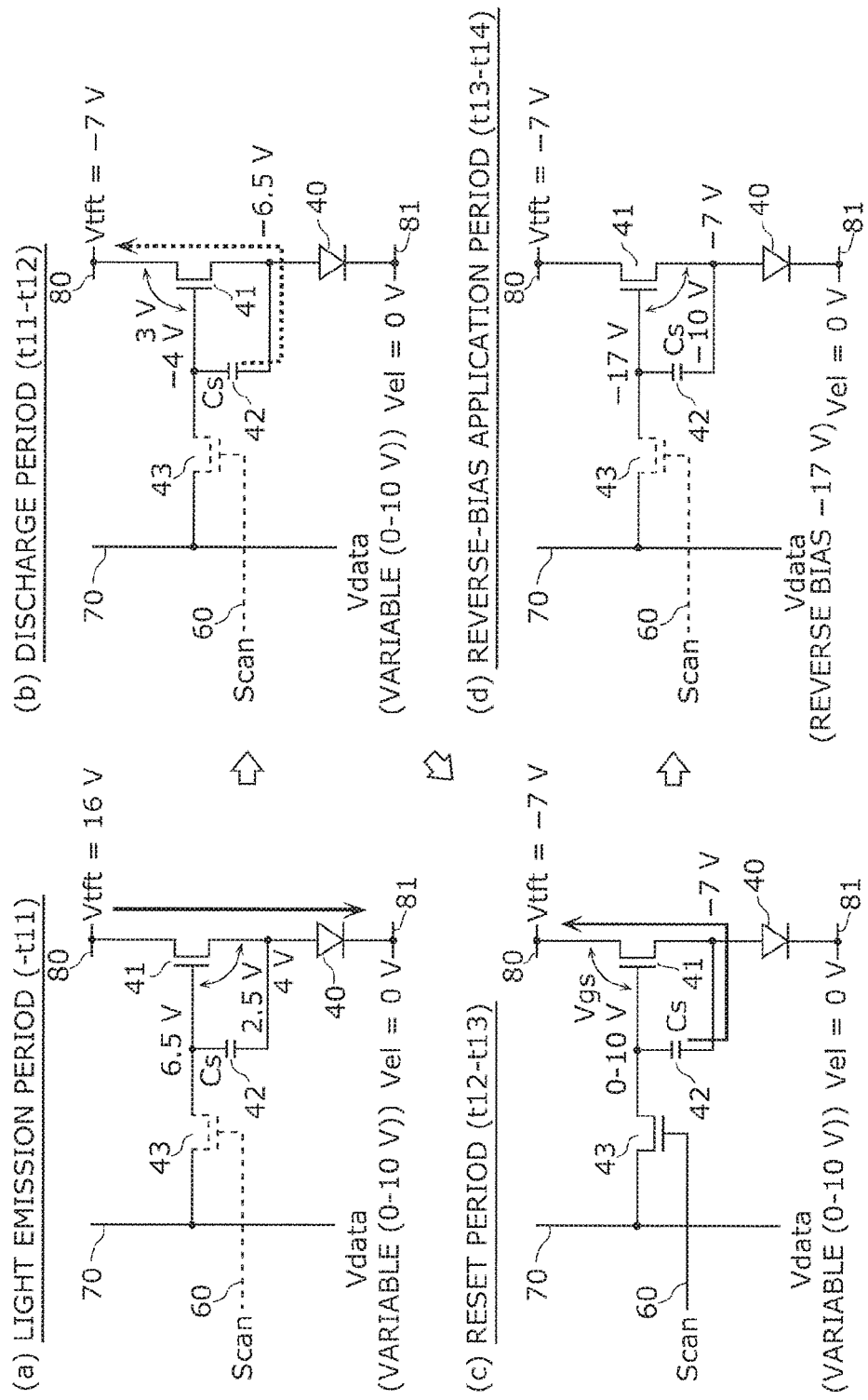

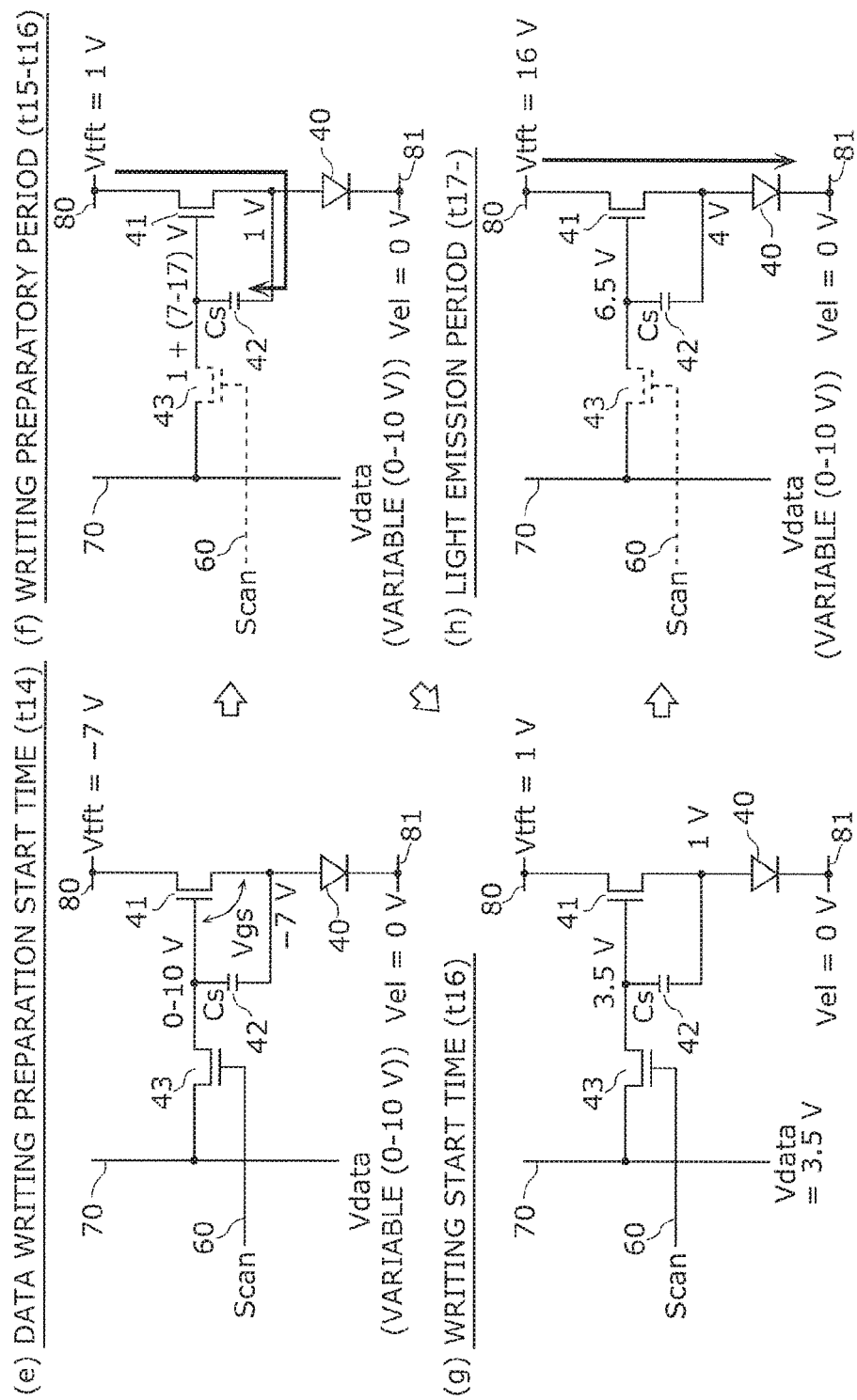

DISPLAY DEVICE AND METHOD FOR DRIVING SAME

TECHNICAL FIELD

The present disclosure relates to a display device and a method for driving the display device.

BACKGROUND ART

Display devices using organic electroluminescent (EL) devices are known as one example of display devices using current-driven light emitting devices. Organic EL display devices using organic EL devices do not require backlighting, which is necessary for liquid crystal display devices, and are best suited to reduce the thickness of the display devices. Additionally, the organic EL display devices provide unrestricted viewing angles and are thus expected to be put to practical use as next-generation display devices.

Active matrix display devices, such as organic EL display devices, include multiple pixels arranged in rows and columns. Each pixel includes an organic EL device, and a driving transistor that supplies driving current corresponding to a pixel signal to the organic EL device.

The driving transistor may be a thin film transistor (TFT). The TFT has a threshold voltage that shifts over time due to stress such as a gate-source voltage applied at the time of energization. Such a time-varying shift in the threshold voltage causes fluctuations in the amount of current supplied to the organic EL device, thus affecting brightness control of the display device and deteriorating display quality.

In contrast, Patent Literature (PTL) 1, for example, discloses a configuration in which fluctuations in the threshold voltage of the driving transistor are suppressed by the application of a reverse bias voltage corresponding to an image signal during a non-light emission period.

CITATION LIST

Patent Literature

[PTL 1]
Japanese Unexamined Patent Application Publication 2009-168969

SUMMARY OF INVENTION

Technical Problem

The configuration described in PTL 1, however, has a problem in that it is difficult to apply a proper reverse bias voltage due to the influence of factors such as variations in the electrical characteristics of the organic EL device and the parasitic capacitance of the driving transistor. Thus, for example, if the reverse bias voltage is too low, fluctuations in the threshold voltage of the driving transistor, caused during a light emission period, may not be suppressed sufficiently. On the contrary, if the reverse bias voltage is too high, the threshold voltage of the driving transistor may be shifted in the reverse direction, and fluctuations in the threshold voltage may not be suppressed.

In view of this, the present disclosure provides a display device that can suppress time-varying fluctuations in the threshold voltage of a transistor with high precision, and also provides a method for driving such a display device.

Solution to Problem

In order to solve the problem described above, the method for driving a display device according to the present disclosure is a method for driving a display device that includes multiple pixels arranged in rows and columns. Each of the plurality of pixels includes a light emitting device that emits light in accordance with supplied current, a driving transistor that supplies current to the light emitting device, and a storage capacitor connected between a gate of the driving transistor and a source or drain of the driving transistor. The method includes causing the light emitting device to emit light by supplying current to the light emitting device, resetting charge of at least one of the storage capacitor and a parasitic capacitance of the light emitting device, and applying a reverse bias voltage between the gate and source of the driving transistor. The resetting is performed between the light emission and the reverse-bias application.

Advantageous Effects of Invention

According to the present disclosure, time-varying fluctuations in the threshold voltage of the transistor can be suppressed with high precision.

BRIEF DESCRIPTION OF DRAWINGS

FIG. 6A is a state transition diagram illustrating the operations of the pixel during high-gradation light emission in the organic EL display device according to Embodiment 1.

FIG. 8A is a state transition diagram illustrating the operations of the pixel in the organic EL display device according to Embodiment 2.

FIG. 8B is a state transition diagram illustrating the operations of the pixel in the organic EL display device according to Embodiment 2.

DESCRIPTION OF EMBODIMENTS

Figure 1:
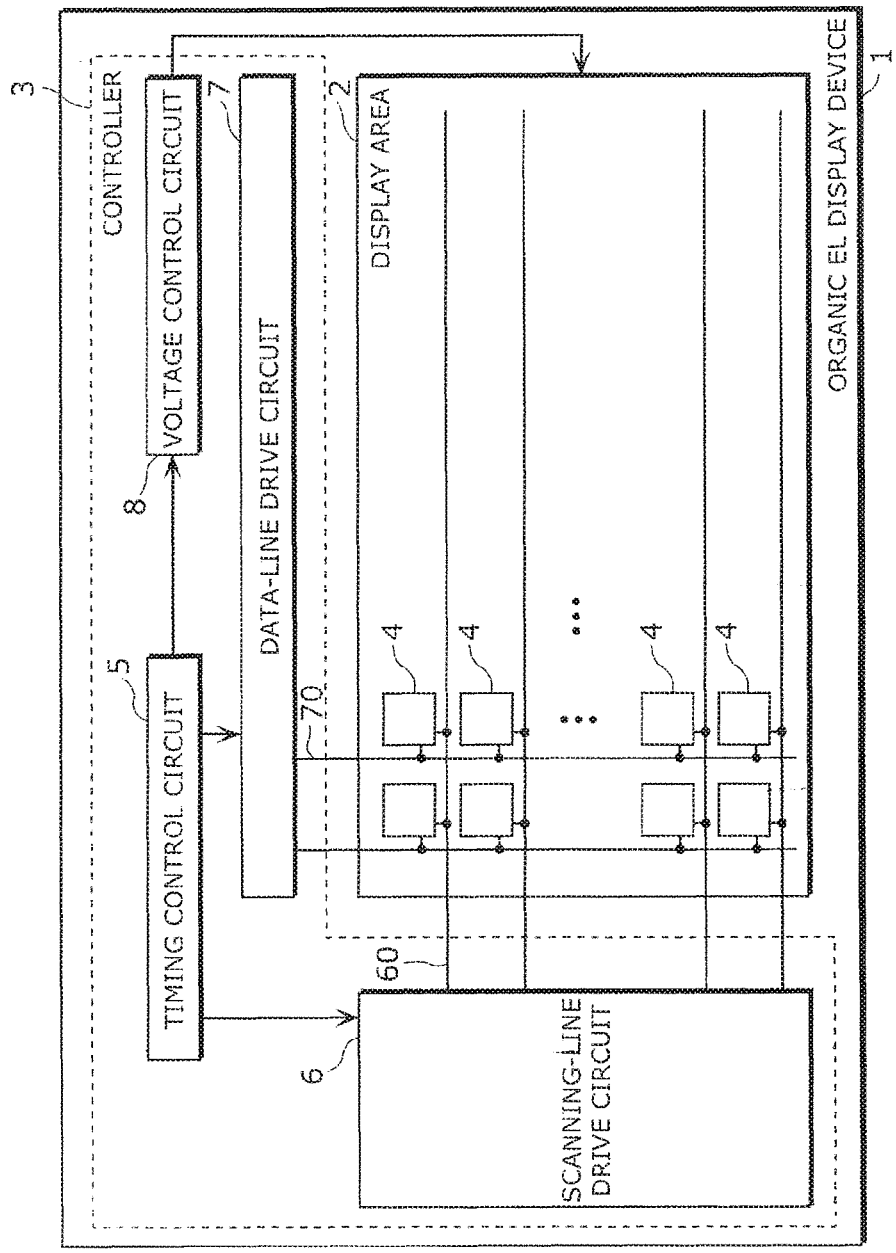
FIG. 1 is a block diagram illustrating an overview of a configuration of an organic EL display device according to Embodiment 1.

Hereinafter, detailed description of embodiments will be given with reference to the drawings as appropriate. Note that detailed description more than necessary may be omitted. For example, detailed description of well-known matter and redundant description of substantially identical constituent elements may be omitted. This is to avoid unnecessary redundancy in the following description and to facilitate the understanding of persons skilled in the art.

Note that the inventors provide the accompanying drawings and the following description to help persons skilled in the art to better understand the present disclosure, and do not intend to limit the subject matter of the claims by the drawings and the description. For example, numerical values, constituent elements, arrangement and positions of constituent elements, and the form of connections to be described in the following embodiments are merely examples and not intended to limit the present disclosure. Among constituent elements of the following embodiments, those that are not recited in any of independent claims, which define the broadest concept of the present disclosure, will be described as optional constituent elements.

The drawings are schematic diagrams and do not always strictly follow the actual configuration. In the drawings, constituent members that are identical are given the same reference numerals.

Embodiment 1

1. Organic EL Display

Figure 2:
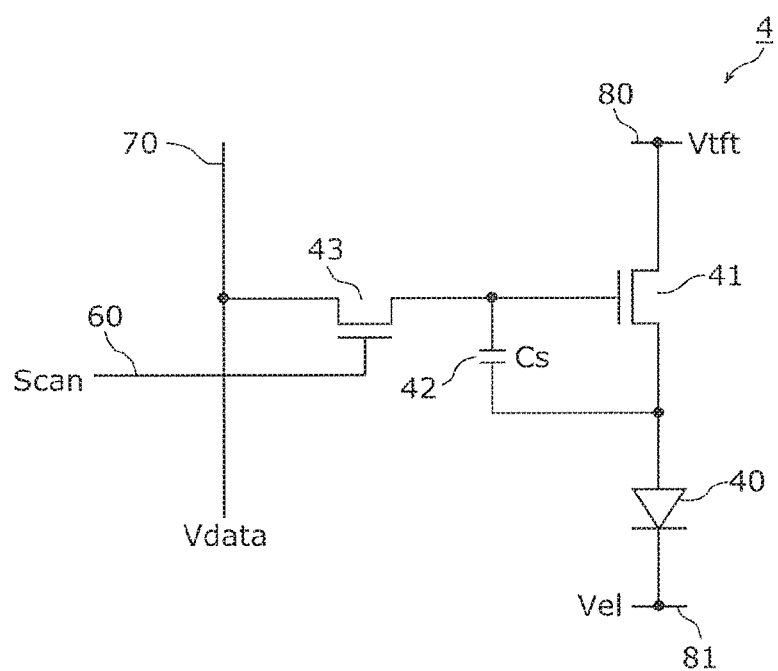
FIG. 2 is a circuit diagram illustrating a circuit configuration of a pixel in the organic EL display device according to Embodiment 1.

First, a configuration of an organic EL display device according to the present embodiment will be described with reference to FIGS. 1 and 2. FIG. 1 is a block diagram illustrating an overview of a configuration of an organic EL display device 1 according to the present embodiment. FIG. 2 is a circuit diagram illustrating a circuit configuration of a pixel 4 in the organic EL display device 1 according to the present embodiment.

As illustrated in FIG. 1, the organic EL display device 1 includes a display area 2 and a controller 3. In the display area 2, pixels 4, which will be described later, are arranged in rows and columns. The controller 3 performs various types of control over the multiple pixels 4 arranged in the display area 2. The controller 3 includes a timing control circuit 5, a scanning-line drive circuit 6, a data-line drive circuit 7, and a voltage control circuit 8 as illustrated in FIG. 1.

The timing control circuit 5 controls, for example, synchronization of the scanning-line drive circuit 6, the data-line drive circuit 7, and the voltage control circuit 8 and the timing of operations of the organic EL display device 1 for each frame.

The scanning-line drive circuit 6 drives scanning lines 60 in the display area 2 on the basis of a control signal received from the timing control circuit 5. For example, the scanning-line drive circuit 6 may be a gate driver integrated circuit (IC). More specifically, the scanning-line drive circuit 6 outputs a scan signal to each pixel 4 on a row-by-row basis in accordance with a vertical synchronization signal and a horizontal synchronization signal. Scan signals are pulse signals that are output to the scanning lines 60 and used to control connected switching transistors 43 (see FIG. 2) into or out of conduction.

The data-line drive circuit 7 drives data lines 70 in the display area 2 on the basis of a control signal received from the timing control circuit 5. For example, the data-line drive circuit 7 may be a source driver IC (data driver IC). More specifically, the data-line drive circuit 7 outputs a pixel signal that indicates the luminance of a pixel, to each pixel 4 on the basis of the horizontal synchronization signal. Pixel signals are output to the data lines 70 and used to indicate the luminance of connected pixels 4.

The voltage control circuit 8 supplies various types of power supply voltages to the display area 2. In the pixel example illustrated in FIG. 2, the various types of power supply voltages include Vtft and Vel that are supplied to each pixel 4 respectively via power lines 80 and 81 (not shown in FIG. 1). Alternatively, the voltage control circuit 8 may be incorporated into the gate driver IC or the data driver IC.

Although not shown, the organic EL display device 1 may further include a central processing unit (CPU), a storage medium such as a read-only memory (ROM) that stores control programs, a working memory such as a random access memory (RAM), and a communication circuit. The pixel signals may be generated by the CPU executing a control program.

2. Circuit Configuration of Pixel

The circuit configuration of a pixel 4 will now be described with reference to FIG. 2.

The pixel 4 Includes an organic EL device 40, a driving transistor 41, a storage capacitor 42, and a switching transistor 43. The pixel 4 is connected to a scanning line 60, a data line 70, and the power lines 80 and 81. The organic EL device 40 emits light at a luminance corresponding to a voltage (i.e., signal voltage) indicated by the pixel signal supplied via the data line 70.

The organic EL device 40 is one example of a light emitting device that emits light according to supplied current. More specifically, the organic EL device 40 emits light at a luminance corresponding to the amount of current supplied from the driving transistor 41. The cathode of the organic EL device 40 is connected to the power line 81, and the anode thereof is connected to the source of the driving transistor 41.

The driving transistor 41 supplies current to the organic EL device 40. The driving transistor 41 may be a voltage-driven driving device that controls the amount of current supplied to the organic EL device 40 and causes the organic EL device 40 to emit light by supplying current to the organic EL device 40.

More specifically, the drain of the driving transistor 41 is connected to the power line 80, and the gate thereof is connected to the data line 70 via the switching transistor 43. The gate of the driving transistor 41 is also connected to a first electrode of the storage capacitor 42, and the source thereof is connected to a second electrode of the storage capacitor 42 and the anode of the organic EL device 40.

In the present embodiment, the source and drain of the driving transistor 41 change places between a light emission period and a capacitance reset period, which will be described later. That is, during the light emission period, the terminal on the power line 80 side of the driving transistor 41 serves as the drain, and the terminal on the power line 81 side thereof serves as the source. On the other hand, during the capacitance reset period, the terminal on the power line 81 side of the driving transistor 41 serves as the drain, and the terminal on the power line 80 side thereof serves as the source. However, in order to simplify the description, the following description is given assuming that the terminal on the power line 80 side of the driving transistor 41 serves as the drain, and the terminal on the power line 81 side thereof serves as the source. The same applies to the other embodiments.

The driving transistor 41 can cause current to flow to the organic EL device 40 by the amount corresponding to the voltage held by the storage capacitor 42. That is, through a light emission operation, the organic EL display device 1 can cause each organic EL device 40 to emit light at a luminance corresponding to the voltage held by the storage capacitor 42.

The threshold voltage of the driving transistor 41 may fluctuate for each pixel 4 due to factors such as an initial distribution at the time of forming a TFT substrate on which the driving transistors 41 are mounted, and a time-varying shift in the threshold voltage. The influence of such fluctuations will be suppressed by applying a reverse bias voltage. More specifically, a reverse bias voltage having a polarity different from the polarity of the signal voltage is applied between the gate and source of the driving transistor 41. In the present embodiment, the signal voltage is a positive bias voltage in the range of 0V to 10V, and therefore, the reverse bias voltage is a negative bias voltage (e.g., −10V).

The details of the operation of applying the reverse bias voltage will be described later.

The storage capacitor 42 is connected between the gate and source of the driving transistor 41 (the storage capacitor 42 holds not only the threshold voltage but also other voltages such as the reverse bias voltage and an image signal voltage). More specifically, the second electrode of the storage capacitor 42 is connected to a node connected to the source (power line 81 side) of the driving transistor 41 and the anode of the organic EL device 40. The first electrode of the storage capacitor 42 is connected to the gate of the driving transistor 41. The first electrode of the storage capacitor 42 is also connected to the data line 70 via the switching transistor 43.

The switching transistor 43 is one example of a switch that is connected between the gate of the driving transistor 41 and the data line 70. The switching transistor 43 switches between conduction and no-conduction of the data line 70 for supplying a pixel signal and the first electrode of the storage capacitor 42 (i.e., the gate of the driving transistor 41).

More specifically, one of the drain and source of the switching transistor 43 is connected to the data line 70, the other of the drain and source thereof is connected to the first electrode of the storage capacitor 42, and the gate thereof is connected to the scanning line 60. In other words, the switching transistor 43 has a function of writing the voltage (i.e., signal voltage) corresponding to the pixel signal supplied via the data line 70, to the storage capacitor 42.

The scanning lines 60 are provided for each row of the pixels 4 in the display area 2. The scanning lines 60 are connected to the scanning-line drive circuit 6 and transmit scan signals to switch between conduction and no-conduction of the switching transistors 43.

The data lines 70 are provided for each column of the pixels 4 in the display area 2. Each data line 70 is connected to each column of the pixels 4, i.e., connected to the pixels 4 of that column. For example, the data line 70 of the m-th column is connected to the switching transistors 43 of the pixels 4 of the m-th column.

The data lines 70 are selectively set to one of multiple potentials including a signal potential corresponding to a pixel signal. In the present embodiment, the data line 70 is selectively set to one of the signal potential, a reset potential, and a reverse bias potential.

The signal potential is a potential that corresponds to the luminance of a pixel 4 and that is supplied to the first electrode of the storage capacitor 42 (i.e., the gate of the driving transistor 41). The luminance of each pixel 4 is determined according to a signal voltage written to the storage capacitor 42. Thus, the signal potential is set to a value obtained by adding a signal voltage corresponding to the luminance of a pixel 4 to a reference potential. The reference potential as used herein is a second potential (described later) that is set to the power line 80.

The reset potential is a potential for bringing the driving transistor 41 into conduction. In the present embodiment, the reset potential is a predetermined potential independent of the signal potential. More specifically, the reset potential is a value obtained by adding a voltage higher than the threshold voltage (e.g., 2V) of the driving transistor 41 to the reference potential.

The reverse bias potential is a potential for applying a reverse bias voltage between the gate and source of the driving transistor 41. More specifically, the reverse bias potential is a potential lower than the reference potential. For example, the reverse bias potential may be a potential lower than the minimum value of the signal potential and may be a negative potential.

The power lines 80 and 81 are provided, for example, for each row of pixels 4 in the display area 2. That is, the power lines 80 and 81 are connected to each row of pixels 4, i.e., connected to the pixels 4 of that row. For example, the power lines 80 and 81 of the n-th row are connected to the drains of the driving transistors 41 of the pixels 4 of the n-th row. Alternatively, the power line 80 may be provided for each row of pixels, and the power line 81 may be provided for each column of pixels.

The power lines 80 are power lines connected to the drains of the driving transistors 41 and for supplying current that causes the organic EL devices 40 to emit light. The power lines 80 are selectively set to a first potential or a second potential lower than the first potential.

The first potential is a potential for passing current through the organic EL devices 40, and may be higher than the potential set to the power lines 81. The power lines 80 that are set to the first potential can supply current that causes the organic EL devices 40 to emit light. The first potential is, for example, 16V.

The second potential is a potential used as a reference at the time of resetting the charge of the storage capacitors 42 and the parasitic capacitances of the organic EL devices 40. The second potential is also used as a reference at the time of writing signal voltages to the storage capacitors 42.

For example, the second potential may be a potential obtained by adding a voltage lower than the threshold voltage (e.g., 2V) of the organic EL devices 40 to the potential set to the power lines 81. The second potential is, for example, 1V. Alternatively, the second potential may be lower than the potential set to the power lines 81. That is, the value of the second potential is determined such that the power lines 80 that are set to the second potential will not supply current that causes the organic EL devices 40 to emit light.

The power lines 81 are connected to the cathodes of the organic EL devices 40. For example, the power lines 81 may be grounded. In other words, the power lines 81 are set to a potential of 0V.

The above-described configuration of the pixels 4 allow the organic EL display device 1 to precisely apply reverse bias voltages to the driving transistors 41 and to more precisely suppress time-varying fluctuations in the threshold voltages of the transistors. The details of this mechanism will be described in the following description about operations.

While the following description assumes that the multiple transistors (driving transistors 41 and switching transistors 43) of the pixels 4 are n-type TFTs, the present disclosure is not limited to this example. The transistors may be p-type TFTs. As another alternative, the transistors may include both n-type and p-type TFTs.

3. Operations of Organic EL Display

Next, the operations of the organic EL display device 1 will be described with reference to FIGS. 3 to 6B. The operations described blow are implemented by the controller 3. The following description takes the example of the case where the driving transistors 41 have a threshold voltage of 2V.

[3-1. Low-Gradation Light Emission]

First, operations of a pixel 4 during low-gradation light emission will be described with reference to FIGS. 3, 4A, and 4B.

Figure 3:
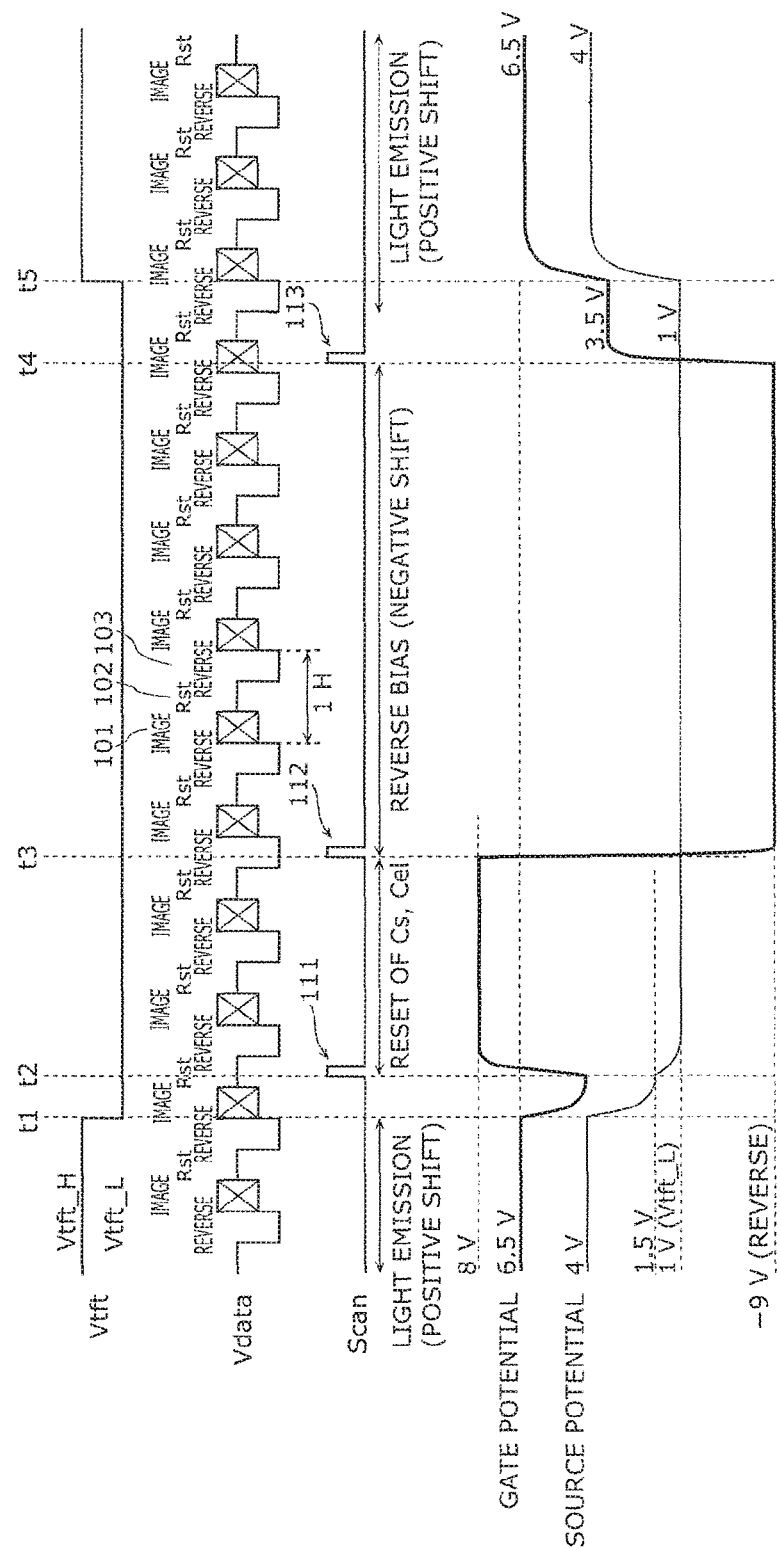
FIG. 3 is a timing chart illustrating operations of a pixel during low-gradation light emission in the organic EL display device according to Embodiment 1.

FIG. 3 is a timing chart illustrating operations of a pixel 4 during low-gradation light emission in the organic EL display device 1 according to the present embodiment. FIGS. 4A and 4B are state transition diagrams illustrating the operations of the pixel 4 during low-gradation light emission in the organic EL display device 1 according to the present embodiment.

More specifically, FIG. 3 illustrates a potential "Vtft" supplied to the power line 80, a potential "Vdata" supplied to the data line 70, a scan signal "Scan" supplied to the scanning line 60, a gate potential (bold solid line) of the driving transistor 41, and a source potential (thin solid line) of the driving transistor 41 from the top in the stated order.

As illustrated in FIG. 3, the power line 80 is selectively set to the first potential Vtft_H or the second potential Vtft_L. More specifically, the power line 80 is set to Vtft_H during a light emission period and to Vtft_L during a non-light emission period.

The data line 70 is sequentially set to a signal potential ("IMAGE" in FIG. 3) for each row of pixels 4 at an interval of one horizontal period (1H). More specifically, one horizontal period includes a first period 101 during which the data line 70 is set to the signal potential, a second period 102 during which the data line 70 is set to the reset potential, and a third period 103 during which the data line 70 is set to the reverse bias potential. In other words, the data line 70 is set to three different potentials during one horizontal period. That is, in the present embodiment, the data-line drive circuit 7 drives the data lines 70 at a frequency that is three times one horizontal frequency (i.e., a reciprocal 1/1H of one horizontal period).

The first period 101, the second period 102, and the third period 103 may be of the same length, more specifically, each period being one third of one horizontal period, but the present disclosure is not limited to this example. The first period 101, the second period 102, and the third period 103 may be of different lengths. For example, the first period 101 is preferably set to be longer than the other periods because the signal potential needs to set an accurate voltage to the storage capacitor 42 of each pixel 4. On the other hand, the second period 102 may be shorter than the first period 101 because the reset potential only needs to bring the driving transistors 41 into conduction and does not need to set a voltage as accurate as that in the case of the signal potential. The reverse bias potential does not need to set a voltage as accurate as that in the case of the signal potential, but preferably sets a voltage with a level of precision that is equal to or higher than that in the case of the reset potential (because the reverse bias potential needs to set an appropriate value in order to suppress time-varying fluctuations in the threshold voltage of the driving transistor). That is, the first period 101 is more preferably set to be longer than the second period 102 and the third period 103.

In the example in FIG. 3, a signal voltage is written at time t4. That is, the signal potential illustrated in FIG. 3, excluding the signal potential at time t4, indicates a signal potential that corresponds to another row of pixels.

The scanning line 60 receives supply of scan signals 111 to 113 for bringing the switching transistors 43 into conduction at predetermined timings. As illustrated in FIG. 3, the scan signals 111 to 113 are pulse signals, each having a pulse width shorter than any of the first period 101, the second period 102, and the third period 103. The scan signals 111 to 113 may have a common pulse width, or each may have a pulse width that is individually set in accordance with the first period 101, the second period 102, and the third period 103. When a pulse signal is supplied, a switching transistor 43 becomes conducting for a period of time that corresponds to the pulse width of the pulse signal.

[Light Emission Period (Until Time t1)]

Figure 4A:
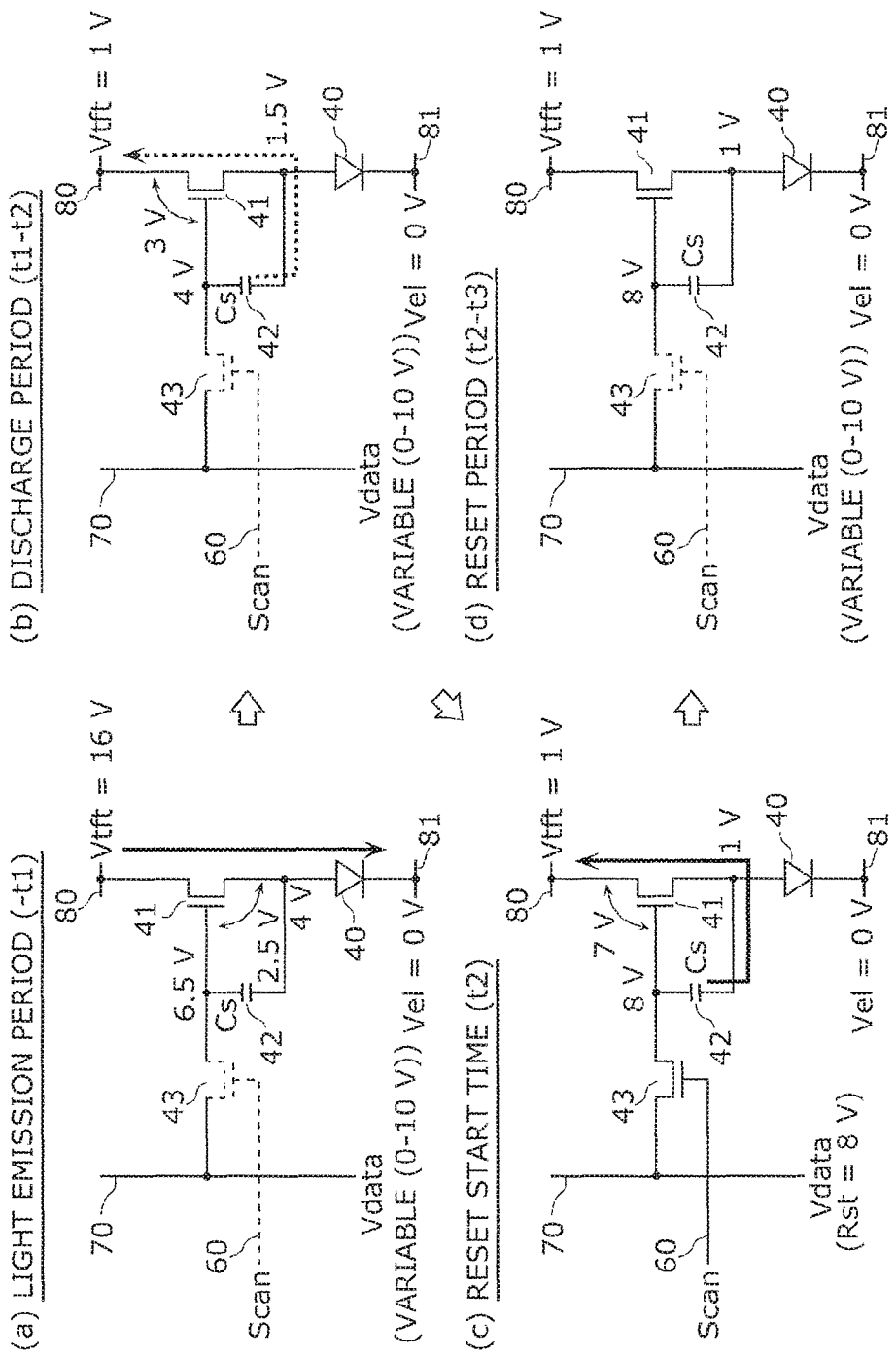
FIG. 4A is a state transition diagram illustrating the operations of the pixel during low-gradation light emission in the organic EL display device according to Embodiment 1.

In a light emission period (until time t1) illustrated in FIG. 3, since the power line 80 is set at Vtft_H, current corresponding to the signal voltage (e.g., 2.5V) held by the storage capacitor 42 flows through the driving transistor 41 to the organic EL device 40 as illustrated in (a) in FIG. 4A. For example, Vtft_H may be 16V.

Accordingly, the organic EL device 40 emits light at a low luminance. At this time, the anode potential of the organic EL device 40 (i.e., the source potential of the driving transistor 41) is 4V, and the gate potential of the driving transistor 41 is 6.5V.

[Discharge Period (from Time t1 to t2)]

Next, the power line 80 is set to Vtft_L at time t1 to end the light emission of the organic EL device 40. For example, Vtft_L may be 1V.

At time t1, the driving transistor 41 has a gate potential of 6.5V and a drain potential of 1V. Thus, the driving transistor 41 is conducting, and the signal voltage held by the storage capacitor 42 is discharged through the driving transistor 41 into the power line 80. The electric discharge causes a drop in the potential across the storage capacitor 42 and causes the driving transistor 41 to have, for example, a gate potential of 4V and a source potential of 1.5V as illustrated in (b) in FIG. 4A.

At this time, since the driving transistor 41 has a threshold voltage of 2V, the charge of the storage capacitor 42 and the parasitic capacitance of the organic EL device 40 is gradually discharged into the power line 80. However, the parasitic capacitance is large, and the ON-state voltage of the driving transistor 41 is insufficient to discharge the charge of both the storage capacitor 42 and the parasitic capacitance of the organic EL device 40 within a prescribed period of time. Accordingly, the charge remains in the source of the driving transistor 41 and becomes a variable potential. The variable potential varies depending on the storage capacitor 42 and the parasitic capacitance of the organic EL device 40.

At this time, the variable potential is also affected by the potential of the power line 81. The potential of the power line 81 fluctuates in the plane of the display area 2 due to a voltage drop caused by wiring resistance. Thus, the source potential differs for each pixel 4, and it becomes approximately 1.5V, i.e., to be exact, a variable potential.

Since the driving transistor 41 has a variable source potential, the magnitude of the reverse bias voltage fluctuates depending on the source potential, and a proper reverse bias voltage cannot be applied. In view of this, in the present embodiment, the source potential of the driving transistor 41 is stabilized by resetting the charge of the storage capacitor 42 and the parasitic capacitance of the organic EL device 40 before application of the reverse bias voltage.

[Capacitance Reset Period (from Time t2 to t3)]

At time t2, a reset potential is supplied to the gate of the driving transistor 41 by supplying the scan signal 111 to the scanning line 60 to bring the switching transistor 43 into conduction as illustrated in (c) in FIG. 4A. At this time, the power line 80 is set at Vtft_L, and the data line 70 is set at the reset potential.

The reset potential as used herein refers to a potential for applying a voltage greater than or equal to the threshold voltage between the gate and drain (power line 80) of the driving transistor 41. The reset potential may be 8V.

As illustrated in (c) in FIG. 4A, the 7V voltage is applied between the gate and drain of the driving transistor 41, and this provides continuity between the source and drain of the driving transistor 41. Accordingly, the charge remaining in the storage capacitor 42 and the parasitic capacitance of the organic EL device 40 is discharged into the power line 80.

As a result, the source potential of the driving transistor 41 becomes 1V, which is the same as that of the power line 80, as illustrated in (d) in FIG. 4A. In this way, the source potential of the driving transistor 41 can be set to be same as the potential of the power line 80 by providing the reset period.

While the reset period (from time t2 to t3) corresponds to approximately two horizontal periods as illustrated in FIG. 3, the present disclosure is not limited to this example. The length of the reset period may be set to allow sufficient discharge time according to, for example, the magnitudes of the storage capacitor 42 and the parasitic capacitance of the organic EL device 40.

[Reverse-Bias Application Period (from Time t3 to t4)]

Figure 4B:
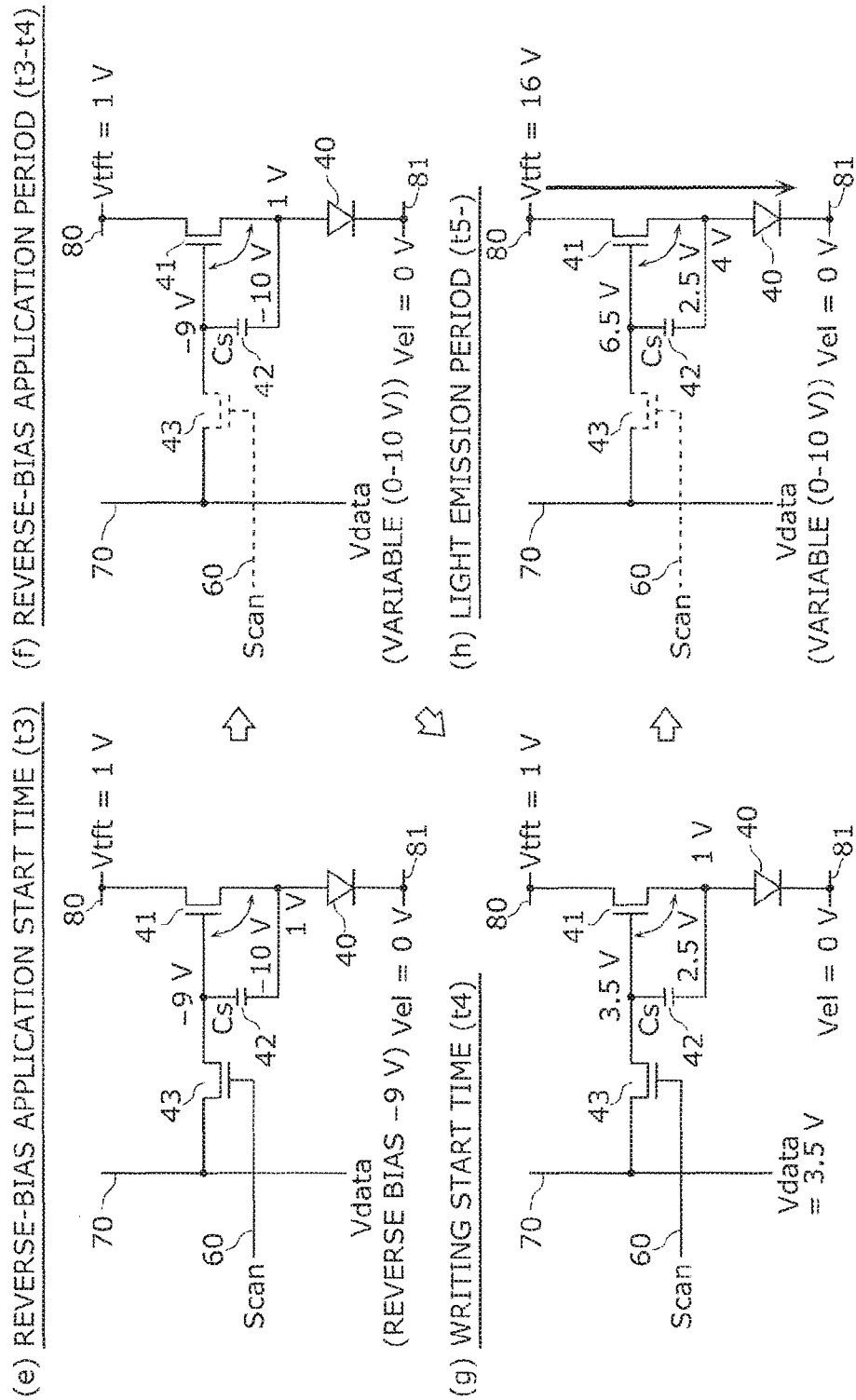
FIG. 4B is a state transition diagram illustrating the operations of the pixel during low-gradation light emission in the organic EL display device according to Embodiment 1.

At time t3, a reverse bias potential is supplied to the gate of the driving transistor 41 by supplying the scan signal 112 to the scanning line 60 to bring the switching transistor 43 into conduction as illustrated in (e) in FIG. 4B. At this time, the power line 80 is set at Vtft_L, and the data line 70 is set at the reverse bias potential.

The reverse bias potential as used herein refers to a potential for applying a reverse bias voltage between the gate and source of the driving transistor 41.

The reverse bias voltage may be a voltage having a different polarity from that of the signal voltage held by the storage capacitor 42. More specifically, the reverse bias voltage may be a negative voltage that is applied between the gate and source of the driving transistor 41. By applying a negative voltage between the gate and source of the driving transistor 41, it is possible to suppress a positive shift in the threshold voltage, the shift being caused by the application of a positive voltage (signal voltage) between the gate and source of the driving transistor 41 during the light emission period.

The reverse bias voltage corresponds to a difference between the gate potential of the driving transistor 41, i.e., the reverse bias potential, and the source potential. Since the source potential is set to Vtft_L, which is the same potential as that of the power line 80, during the reset period, the reverse bias voltage is a difference between the reverse bias potential of the data line 70 and the potential Vtft_L of the power line 80. That is, an appropriate reverse bias voltage can be applied between the gate and source of the driving transistor 41 without being affected by variations in the electrical characteristics of the organic EL device 40 and a voltage drop in the power line 81.

In the present embodiment, the reverse bias potential is lower than the potential Vtft_L of the power line 80 and may be −9V. Since the source potential of the driving transistor 41 is set at 1V, a reverse bias voltage of −10V is applied between the gate and drain of the driving transistor 41 as illustrated in (f) in FIG. 4B. Accordingly, it is possible to suppress time-varying fluctuations in the threshold voltage of the driving transistor 41. Note that the reverse bias potential is not always a negative voltage. For example, the reverse bias potential may be 0V. This is because in this case, a reverse bias voltage of −1V will be applied between the gate and source of the driving transistor 41 since the source potential of the driving transistor 41 is set at 1V, and accordingly a similar effect can be expected to be achieved. In this way, the reverse bias potential is not always a negative voltage if it is set in consideration of a potential that can be output from the data-line drive circuit 7 and the characteristics of the driving transistor 41.

While the reverse-bias application period (from time t3 to t4) corresponds to approximately five horizontal periods as illustrated in FIG. 3, the present disclosure is not limited to this example. The length of the reverse-bias application period may be set to allow sufficient time to suppress time-varying fluctuations in the threshold voltage according to, for example, the characteristics of the driving transistor 41.

[Writing of Signal Voltage (Time t4)]

At time t4, a signal voltage is written to the storage capacitor 42 by supplying the scan signal 113 to the scanning line 60 to bring the switching transistor 43 into conduction as illustrated in (g) in FIG. 4B. At this time, the power line 80 is set at Vtft_L, and the data line 70 is set at the signal potential.

The signal potential at this time is a signal potential corresponding to the current own pixel. That is, the signal potential corresponds to the luminance at which the current pixel is to emit light in the next light emission period. In the example illustrated in (g) in FIG. 4B, the signal potential corresponds to, for example, a value obtained by adding a low-gradation (low-luminance) signal voltage (e.g., 2.5V) to the reference potential (e.g., 1V), more specifically, 3.5V.

[Light Emission Period (from Time t5)]

At time t5, current is supplied from the power line 80 through the driving transistor 41 to the organic EL device 40 by setting the power line 80 to Vtft_H. As a result, current corresponding to the signal voltage (e.g., 2.5V) held by the storage capacitor 42 flows and causes the organic EL device 40 to emit light as illustrated in (h) in FIG. 4B.

As described above, in the case of low-gradation light emission, the source potential of the driving transistor 41 may become variable before application of the reverse bias voltage. Thus, the capacitance reset period is provided before the application of the reverse bias voltage so as to set the source potential of the driving transistor 41 to the second potential (Vtft_L) of the power line 80. This allows the application of an appropriate reverse bias voltage.

[3-2. High-Gradation Light Emission]

Next, operations of a pixel 4 during high-gradation light emission will be described with reference to FIGS. 5, 6A, and 6B.

Figure 5:
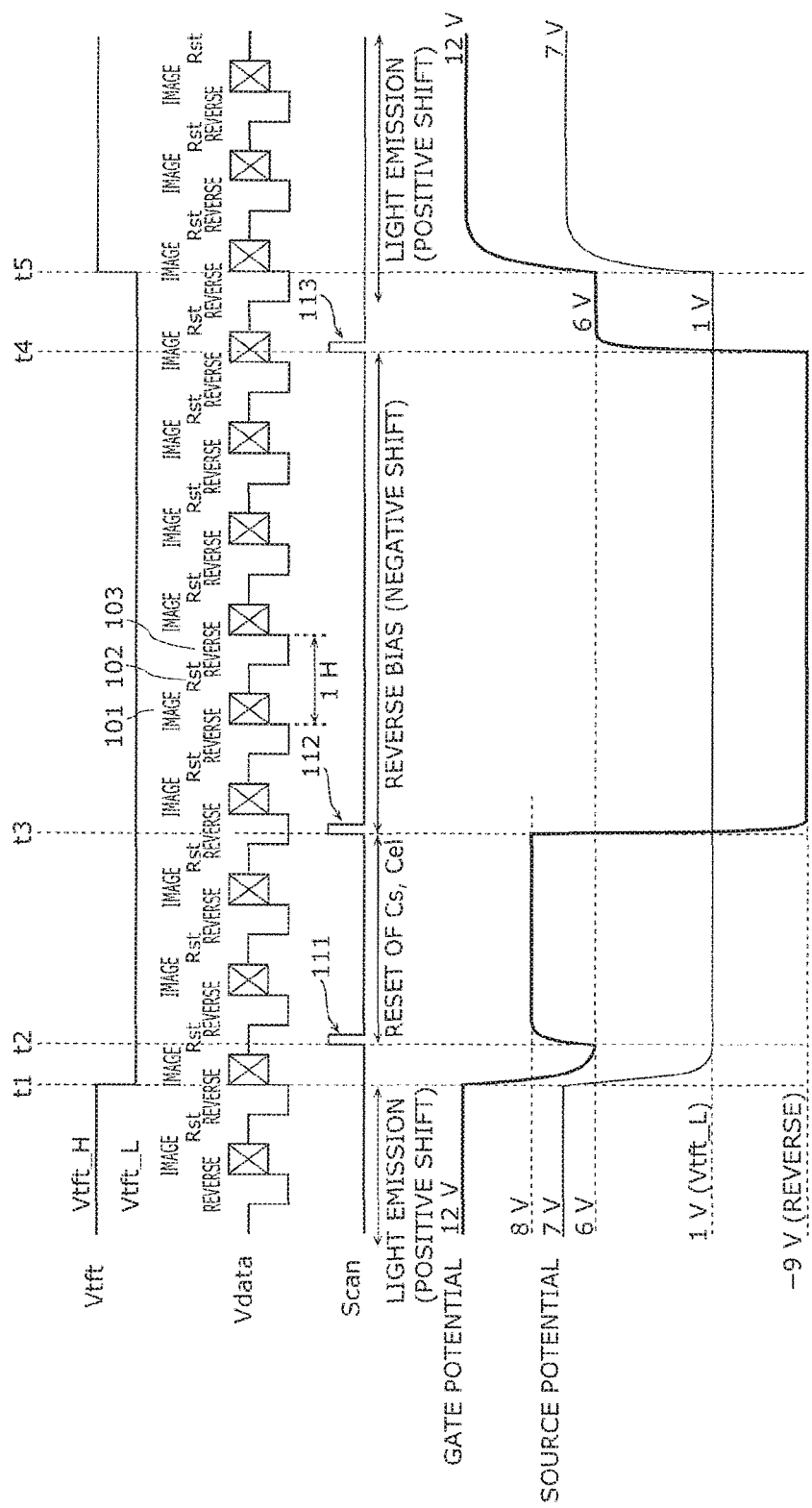
FIG. 5 is a timing chart illustrating operations of a pixel during high-gradation light emission in the organic EL display device according to Embodiment 1.

FIG. 5 is a timing chart illustrating operations of a pixel 4 during high-gradation light emission in the organic EL display device 1 according to the present embodiment. More specifically, FIG. 5 illustrates a potential "Vtft" supplied to the power line 80, a potential "Vdata" supplied to the data line 70, a scan signal "Scan" supplied to the scanning line 60, the gate potential (bold solid line) of the driving transistor 41, and the source potential (thin solid line) of the driving transistor 41 from the top in the stated order.

Figure 6B:
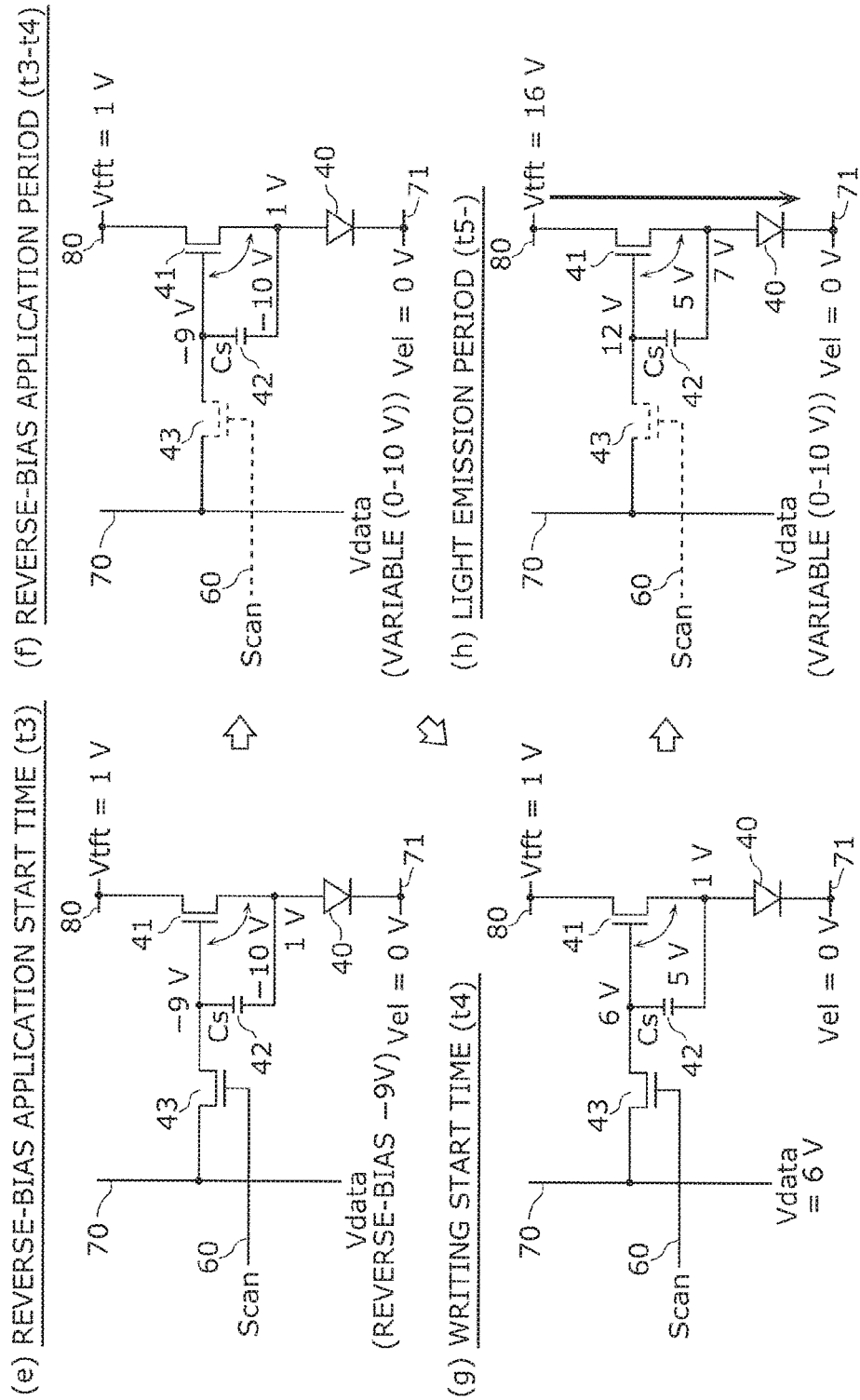
FIG. 6B is a state transition diagram illustrating the operations of the pixel during high-gradation light emission in the organic EL display device according to Embodiment 1.

FIGS. 6A and 6B are state transition diagrams Illustrating the operations of the pixel 4 during high-gradation light emission in the organic EL display device 1 according to the present embodiment.

Description of operations that are the same as those during low-gradation light emission described above will be omitted.

[Light Emission Period (Until Time t1)]

In the light emission period (until time t1) illustrated in FIG. 5, since the power line 80 is set at Vtft_H, current corresponding to the signal voltage (e.g., 5V) held by the storage capacitor 42 flows through the driving transistor 41 to the organic EL device 40 as illustrated in (a) in FIG. 6A. Accordingly, the organic EL device 40 emits light at a high luminance. At this time, the anode potential of the organic EL device 40 (i.e., the source potential of the driving transistor 41) is 7V, and the gate potential of the driving transistor 41 is 12V.

[Discharge Period (from Time t1 to t2)]

Next, the power line 80 is set to Vtft_L at time t1 to end the light emission of the organic EL device 40.

At time t1, the driving transistor 41 has a gate potential of 12V and a drain potential of 1V. Thus, the driving transistor 41 is conducting, and the signal voltage held by the storage capacitor 42 is discharged through the driving transistor 41 into the power line 80. The electric discharge causes a drop in the potential across the storage capacitor 42 and causes the driving transistor 41 to have, for example, a gate potential of 6V and a source potential of 1V as illustrated in (b) in FIG. 6A.

That is, in the case of high-gradation light emission, the source potential of the driving transistor 41 becomes the same potential Vtft_L as that of the power line 80 while the driving transistor 41 is completely conducting, which is different from the case of low-gradation light emission. That is, there is no need to provide a reset period because the storage capacitor 42 and the parasitic capacitance of the organic EL device 40 are reset.

However, it is unclear what gradation level of signal voltage will be written to each pixel 4. Thus, the reset period is still necessary in order to reliably reset the storage capacitor 42 and the parasitic capacitance of the organic EL device 40.

[Capacitance Reset Period (from Time t2 to t3)]

At time t2, a reset potential is supplied to the gate of the driving transistor 41 by supplying the scan signal 111 to the scanning line 60 to bring the switching transistor 43 into conduction as illustrated in (c) in FIG. 6A. At this time, the power line 80 is set at Vtft_L, and the data line 70 is set at the reset potential.

At this time, the 7V voltage is applied between the gate and drain (power line 80) of the driving transistor 41, and this provides continuity between the source and drain of the driving transistor 41. However, the charge held by the storage capacitor 42 and the parasitic capacitance of the organic EL device 40 has already been discharged into the power line 80 during the discharge period (time t1 to t2). Thus, in actuality, there is no flow of charge during the reset period, and the source potential of the driving transistor 41 remains at Vtft_L. Accordingly, the source potential of the driving transistor 41 is 1V, which is the same as that of the power line 80 as illustrated in (d) in FIG. 6A.

[Reverse-Bias Application Period (from Time t3 to t4)]

At time t3, a reverse bias potential is supplied to the gate of the driving transistor 41 by supplying the scan signal 112 to the scanning line 60 to bring the switching transistor 43 into conduction as illustrated in (e) in FIG. 6B. At this time, the power line 80 is set at Vtft_L, and the data line 70 is set at the reverse bias potential.

More specifically, a reverse bias voltage of −10V is applied between the gate and source of the driving transistor 41 as illustrated in (f) in FIG. 6B. Accordingly, it is possible to suppress time-varying fluctuations in the threshold voltage of the driving transistor 41.

[Writing of Signal Voltage (Time t4)]

At time t4, a signal voltage is written to the storage capacitor 42 by supplying the scan signal 113 to the scanning lines 60 to bring the switching transistor 43 into conduction as illustrated in (g) in FIG. 6B. At this time, the power line 80 is set at Vtft_L, and the data line 70 is set at the signal potential. In the example illustrated in (g) in FIG. 6B, the signal potential corresponds to, for example, a value obtained by adding a high-gradation (high-luminance) signal voltage (e.g., 5V) to the reference potential (e.g., 1V), more specifically, 6V.

[Light Emission Period (from Time t5)]

At time t5, current is supplied from the power line 80 through the driving transistor 41 to the organic EL device 40 by setting the power line 80 to Vtft_H. As a result, current corresponding to the signal voltage (e.g., 5V) held by the storage capacitor 42 flows and causes the organic EL device 40 to emit light as illustrated in (h) in FIG. 4B.

As described above, in the case of high-gradation light emission, the source potential of the driving transistor 41 becomes the same potential as that of the power line 80 before application of the reverse bias voltage. Thus, there is no need to provide the capacitance reset period before the application of the reverse bias voltage, but the reset period may be provided for cases of low-gradation light emission so that an appropriate reverse bias voltage can be applied. Note that, even if the reset period is provided, there would be no adverse effects on operations during high-gradation light emission as described above.

4. Advantageous Effects

As described above, the method for driving the organic EL display device 1 according to the present embodiment is a method for driving the organic EL display device 1 that includes the multiple pixels 4 arranged in rows and columns, each pixel including the organic EL device 40 that emits light in accordance with supplied current, the driving transistor 41 that supplies current to the organic EL device 40, and the storage capacitor 42 connected between the gate of the driving transistor 41 and the source or drain thereof. The method for driving the organic EL display device 1 includes a light emission step of causing the organic EL device 40 to emit light by supplying current to the organic EL device 40, a reset step of resetting the charge of at least one of the storage capacitor 42 and the parasitic capacitance of the organic EL device 40, and a reverse-bias application step of applying a reverse bias voltage between the gate and source of the driving transistor 41. The reset step is executed between the light emission step and the reverse-bias application step.

Since the charge of at least one of the storage capacitor 42 and the parasitic capacitance of the organic EL device 40 is reset before the application of the reverse bias voltage, an appropriate reverse bias voltage can be applied between the gate and source of the driving transistor 4. That is, although the source potential of the driving transistor 41 becomes variable without resetting of the charge of the storage capacitor 42 and the parasitic capacitance, in the present embodiment, the source potential is set to the potential of the power line 80 (more specifically, second potential). Accordingly, the source potential will also not be affected by a voltage drop caused by the wiring resistance of the power line 81.

The steady source potential allows an appropriate reverse bias potential to be applied to the data line 70 and thereby allows an appropriate reverse bias voltage to be applied between the gate and source of the driving transistor 41. As a result, it is possible to more precisely suppress time-varying fluctuations in the threshold voltage of the driving transistor 41.

The organic EL display device 1 of the present embodiment further includes, for example, the power lines 80 connected to the drains or sources of the driving transistors 41 of the pixels 4, and the data lines 70 provided for each column of the pixels 4. Each of the pixels 4 further includes the switching transistor 43 connected between the gate of the driving transistor 41 and the data line 70. In the reset step, the charge of at least one of the storage capacitor 42 and the parasitic capacitance is discharged into the power line 80 by bringing the switching transistor 43 into conduction to supply the reset potential from the data line 70 to the gate of the driving transistor 41 and to thereby bring the driving transistor 41 into conduction.

In this way, the source potential of the driving transistor 41 can be set to be the same as the potential of the power line 80 with use of the driving transistor 41. That is, there is no need to provide other devices such as a reset transistor for resetting the source potential of the driving transistor 41, and therefore the circuit configuration is simplified. The resetting may be implemented by a so-called 2Tr1C circuit configuration that includes two transistors and one capacitor as illustrated in FIG. 2.

In the present embodiment, the power lines 80 are selectively set to the first potential or the second potential lower than the first potential, and the data lines 70 are selectively set to one of multiple potentials including a signal potential corresponding to a pixel signal. In the light emission step, current is supplied from the power lines 80 through the driving transistors 41 to the organic EL devices 40 by setting the power lines 80 to the first potential. In the reset step, the reset potential is supplied to the gates of the power lines 80 by bringing the switching transistors 43 into conduction while the power lines 80 are set to the second potential and the data lines 70 are set to the reset potential. In the reverse-bias application step, the reverse bias voltage is applied by bringing the switching transistors 43 into conduction to supply the reverse bias potential to the gates of the driving transistors 41 while the power lines 80 are set to the second potential and the gate lines 70 are set to the reverse bias potential.

The reset potential in the present embodiment may be a predetermined potential independent of the signal potential.

It is thus possible to supply a reset potential that can reliably bring the driving transistors 41 into conduction and to thereby reliably reset the charge.

In the present embodiment, the data lines 70 are sequentially set to a signal potential for each row of the pixels 4 at an interval of one horizontal period. One horizontal period includes the first period 101 during which the data lines 70 are set to the signal potential, the second period 102 during which the data lines 70 are set to the reset potential, and the third period 103 during which the data lines 70 are set to the reverse bias potential.

In the present embodiment, the data lines 70 may be driven at a frequency that is three times one horizontal frequency (1/1H). That is, the data lines 70 are driven at three-times speed.

In this way, the data-line drive circuit 7 needs to drive the data lines 70 at three-times higher frequency (driven at three-times speed) so that the signal potential, the reset potential, and the reverse bias potential are supplied within one horizontal period. On the other hand, the voltage control circuit 8 only needs to drive the power lines 80 using two values, namely, the first potential and the second potential. That is, power consumption can be suppressed as compared to the case of using three values to drive the power lines 80. Additionally, this is achieved by a simple configuration, and therefore an increase in cost can be suppressed.

Since the first potential and the second potential are, for example, respectively 16V and 1V, the charge of the capacitances can be reset within a range of potentials used for light emission of the organic EL devices 40. Moreover, the reverse bias potential may be −9V, and accordingly the withstand voltage required for the data-line drive circuit 7 may be reduced. This allows the use of a conventional voltage control circuit 8, thus suppressing an increase in cost.

Embodiment 2

The following describes an organic EL display device and a method for driving the organic EL display device according to Embodiment 2.

The present embodiment is identical to Embodiment 1 in the configuration of the organic EL display device and the configuration of pixels, and differs in the operations of driving the organic EL display device. Thus, the following description focuses mainly on the driving operations, and description of consistent elements will be omitted.

Figure 7:
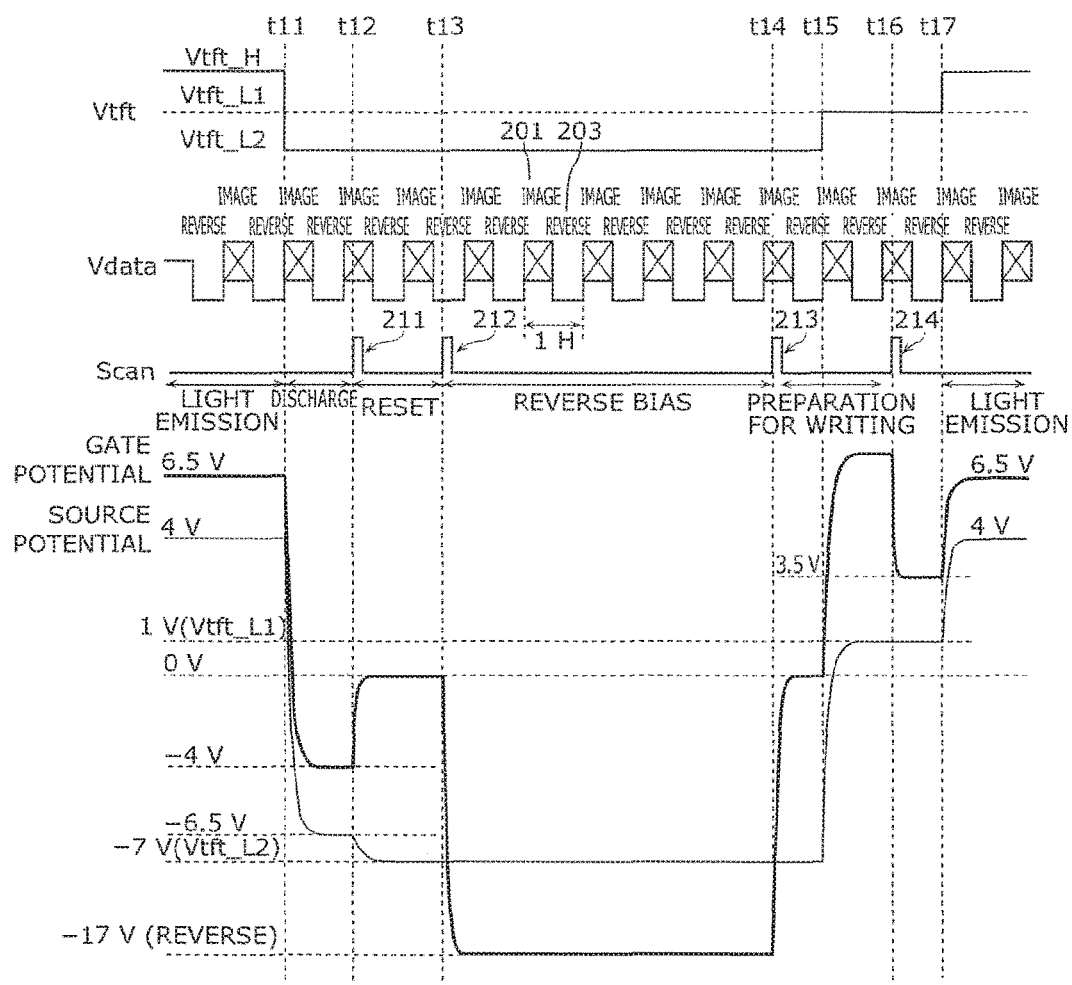
FIG. 7 is a timing chart illustrating operations of a pixel in an organic EL display device according to Embodiment 2.

FIG. 7 is a timing chart illustrating operations of a pixel 4 in the organic EL display device 1 according to the present embodiment. FIGS. 8A and 8B are state transition diagrams illustrating the operations of the pixel 4 in the organic EL display device 1 according to the present embodiment.

More specifically, FIG. 7 illustrates a potential "Vtft" supplied to the power line 80, a potential "Vdata" supplied to the data line 70, a scan signal "Scan" supplied to the scanning line 60, the gate potential (bold solid line) of the driving transistor 41, and the source potential (thin solid line) of the driving transistor 41 from the top in the stated order.

As illustrated in FIG. 7, the power line 80 is selectively set to one of a first potential Vtft_H, a second potential Vtft_L2, and a third potential Vtft_L1. More specifically, the power line 80 is set to Vtft_H during light emission periods and set to either Vtft_L1 or Vtft_L2 during non-light emission periods. Note that Vtft_L1 is a potential lower than Vtft_H and higher than Vtft_L2. The potential Vtft_L1 is used as a reference at the time of wiring a signal voltage. The potential Vtft_L2 is used as a reference at the time of resetting the charge of the storage capacitor 42 and the parasitic capacitance of the organic EL device 40.

The data line 70 is sequentially set to a signal potential ("IMAGE" in FIG. 7) for each row of the pixels 4 at an interval of one horizontal period (1H). One horizontal period includes a first period 201 during which the data line 70 is set to the signal potential, and a third period 203 during which the data line 70 is set to the reverse bias potential. In other words, the data line 70 is set to two different potentials during one horizontal period. That is, the data-line drive circuit 7 of the present embodiment drives the data lines 70 at a frequency that is twice of one horizontal frequency (1/1H).

More specifically, a signal potential for another row is used as a reset potential for resetting the change of the storage capacitor 42 and the parasitic capacitance of the organic EL device 40. That is, the reset potential in the present embodiment is a signal potential for another row.

The first period 201 and the third period 203 are of the same length, more specifically, each period being half of one horizontal period, but the present disclosure is not limited to this example. The first period 201 and the third period 203 may be of different lengths. For example, the first period 201 is preferably set to be longer than the third period 203 because the signal potential needs to set an accurate voltage to the storage capacitor 42 of each pixel 4. On the other hand, the third period 203 may be shorter than the first period 201 because the reverse bias potential does not need to set a voltage as accurate as that in the case of the signal potential.

In the example illustrated in FIG. 7, a signal voltage is written at time t16. That is, the signal potential illustrated in FIG. 7, excluding the signal potential at time t16, indicates a signal potential that corresponds to another row of pixels. In the present embodiment, the signal potential is set by using Vtft_L1 as a reference potential.

The scanning line 60 receives supply of scan signals 211 to 214 for bringing the switching transistor 43 into conduction at predetermined timings. As illustrated in FIG. 7, the scan signals 211 to 214 are pulse signals, each having a pulse width shorter than any of the first period 201 and the third period 203. The scan signals 211 to 214 may have a common pulse width, or each may have a pulse width that is individually set in accordance with the first period 201 and the third period 203. When a pulse signal is supplied, the switching transistor 43 becomes conducting for a period of time that corresponds to the pulse width of the pulse signal.

[Light Emission Period (Until Time t11)]

In the light emission period (until time t11) illustrated in FIG. 7, since the power line 80 is set at Vtft_H, current corresponding to the signal voltage (e.g., 2.5V) held by the storage capacitor 42 flows through the driving transistor 41 to the organic EL device 40 as illustrated in (a) in FIG. 8A.

Accordingly, the organic EL device 40 emits light at a low luminance. At this time, the anode potential of the organic EL device 40 (i.e., the source potential of the driving transistor 41) is 4V, and the gate potential of the driving transistor 41 is 6.5V.

[Discharge Period (from Time t11 to t12)]

Next, the power line 80 is set to Vtft_L2 at time t11 to end the light emission of the organic EL device 40. For example, Vtft_L2 may be −7V.

At time t11, the driving transistor 41 has a gate potential of 6.5V and a drain potential of −7V. Thus, the driving transistor 41 is conducting, and the signal voltage held by the storage capacitor 42 is discharged through the driving transistor 41 into the power line 80. The electric discharge causes a drop in the potential across the storage capacitor 42 and causes the driving transistor 41 to have, for example, a gate potential of −4V and a source potential of −6.5V as illustrated in (b) in FIG. 8A.

At this time, since the driving transistor 41 has a threshold voltage of 2V, the charge of the storage capacitor 42 and the parasitic capacitance of the organic EL device 40 is gradually discharged into the power line 80. However, the parasitic capacitance is large, and the ON-state voltage of the driving transistor 41 is insufficient to discharge the charge of the storage capacitor 42 and the parasitic capacitance of the organic EL device 40 within a prescribed period of time. Accordingly, the charge remains in the source of the driving transistor 41 and becomes a variable potential. The variable potential varies depending on the storage capacitor 42 and the parasitic capacitance of the organic EL device 40.

[Capacitance Reset Period (from Time t12 to t13)]

At time t12, a signal potential for another line is supplied to the gate of the driving transistor 41 by supplying the scan signal 211 to the scanning line 60 to bring the switching transistor 43 into conduction as illustrated in (c) in FIG. 8A. At this time, the power line 80 is set at Vtft_L2, and the data line 70 is set at the signal potential for the other line.

In the present embodiment, a signal potential for another line is used to reset the charge of the storage capacitor 42 and the parasitic capacitance of the organic EL device 40. A signal potential for another line may be a variable potential in the range of 0V to 10V. Thus, the potential Vtft_L2 supplied to the power line 80 is set to −7V so that the driving transistor 41 is brought into conduction irrespective of the signal potential applied to the data line 70.

More specifically, the gate of the driving transistor 41 is set to a potential in the range of 0V to 10V according to the signal potential for the other line, and the drain thereof is set to a potential of −7V as illustrated in (c) in FIG. 8A. Thus, a voltage of at least 7V is applied between the gate and drain of the driving transistor 41, and this provides continuity between the source and drain of the driving transistor 41. Accordingly, the charge remaining in the storage capacitor 42 and the parasitic capacitance of the organic EL device 40 is discharged into the power line 80.

As a result, the source of the driving transistor 41 becomes −7V, which is the same as that of the power line 80. In this way, the source potential of the driving transistor 41 can be set to be the same as the potential of the power line 80 by providing the reset period.

[Reverse-Bias Application Period (from Time t13 to t14)]

At time t13, a reverse bias potential is supplied to the gate of the driving transistor 41 by supplying the scan signal 212 to the scanning line 60 to bring the switching transistor 43 into conduction as illustrated in (d) in FIG. 8A. At this time, the power line 80 is set at Vtft_L2, and the data line 70 is set at the reverse bias potential.

Here, since the source potential of the driving transistor 41 is set to Vtft_L2, which is the same potential as that of the power line 80, during the reset period, the reverse bias voltage is a difference between the reverse bias potential of the data line 70 and the potential Vtft_L2 of the power line 80. That is, an appropriate reverse bias voltage can be applied between the gate and source of the driving transistor 41 without being affected by variations in the electrical characteristics of the organic EL device 40 and a voltage drop in the power line 81.

In the present embodiment, the reverse bias potential is lower than the potential Vtft_L2 of the power line 80 and may be −17V. Since the source potential of the driving transistor 41 is set at −7V, a reverse bias voltage of −10V is applied between the gate and source of the driving transistor 41 as illustrated in (d) in FIG. 8A. It is thus possible to suppress time-varying fluctuations in the threshold voltage of the driving transistor 41.

In the present embodiment, the source potential of the driving transistor 41 is −7V, which is lower than that (i.e., 1V) in Embodiment 1. Thus, the potential required as the reverse bias potential is −17V, which is lower than that (i.e., −9V) required in the Embodiment 1.

[Writing Preparatory Period (from Time t14 to t16)]

At time t14, a signal potential for another line is supplied to the gate of the driving transistor 41 by supplying the scan signal 213 to the scanning line 60 to bring the switching transistor 43 into conduction as illustrated in (e) in FIG. 8B. At this time, the power line 80 is set at Vtft_L2, and the data line 70 is set at the signal potential for the other line.

Accordingly, a value greater than the threshold voltage (2V), more specifically, a 7V voltage or more, is applied between the gate and source of the driving transistor 41, and this provides continuity between the drain and source of the driving transistor 41.

At time t15, the power line 80 is set to Vtft_L1 as illustrated in (f) in FIG. 8B. For example, Vtft_L1 may be 1V. Since the driving transistor 41 is conducting, charge is supplied from the power line 80 to the storage capacitor 42, and the source potential of the driving transistor 41 becomes 1V, which is the same as the potential of the power line 80.

As described above, the source potential is set to Vtft_L1 before the signal voltage is written. Thus, an appropriate signal voltage can be written to the storage capacitor 42. The signal potential supplied to the data line 70 is determined by using the potential Vtft_L1 as a reference. Thus, the source potential can be set to Vtft_L1, which is the reference potential, and an appropriate signal voltage can be written to the storage capacitor 42 by providing the writing preparatory period (from t14 to t16).

[Writing of Signal Voltage (Time t16)]

At time t16, the signal voltage is written to the storage capacitor 42 by supplying the scan signal 214 to the scanning line 60 to bring the switching transistor 43 into conduction as illustrated in (g) in FIG. 8B. At this time, the power line 80 is set at Vtft_L1, and the data line 70 is set at the signal potential.

At this time, the signal potential is a signal potential corresponding to the current pixel. That is, the signal potential corresponds to the luminance at which the current pixel is to emit light in the next light emission period. In the example illustrated in (g) in FIG. 8B, the signal potential corresponds to, for example, a value obtained by adding a low-gradation (low-luminance) signal voltage (e.g., 2.5V) to the reference potential (e.g., 1V), more specifically, 3.5V.

[Light Emission Period (from Time t17)]

At time t17, current is supplied from the power line 80 through the driving transistor 41 to the organic EL device 40 by setting the power line 80 to Vtft_H. As a result, current corresponding to the signal voltage (e.g., 2.5V) held by the storage capacitor 42 flows and causes the organic EL device 40 to emit light as illustrated in (h) in FIG. 8B.

As described above, in the case of low-gradation light emission, the source potential of the driving transistor 41 may become variable before application of the reverse bias voltage. Thus, the capacitance reset period is provided before the application of the reverse bias voltage so as to set the source potential of the driving transistor 41 to the second potential (Vtft_L2) of the power line 80. This allows the application of an appropriate reverse bias voltage.

Moreover, the source potential of the driving transistor 41 is set to the third potential (Vtft_L1) of the power line 80 by providing the writing preparatory period. This allows an appropriate signal voltage to be written to the storage capacitor 42.

As described above, the reset potential in the present embodiment is a signal potential for another line.

In the present embodiment, the data lines 70 are driven at a frequency that is twice of one horizontal frequency (1/1H). That is, the data line 70 is driven at double speed.

Since a signal potential for another row is used as the reset potential, the data line 70 may be driven at a double frequency (at double speed) so that the signal potential (reset potential) and the reverse bias potential are supplied within one horizontal period. Accordingly, the data lines 70 can be driven at a lower speed than in Embodiment 1. This reduces the power consumption of the data-line drive circuit 7.

In the present embodiment, the power lines 80 are further selectively set to the third potential, which is lower than the first potential and higher than the second potential. The method for driving the organic EL display device 1 further includes the writing preparatory step and the writing step. In the writing preparatory step, the source and drain of the driving transistor 41 are set to the third potential by first bringing the switching transistor 43 into conduction, while the power line 80 is set at the second potential and the data line 70 is set at the signal potential for another row, to supply the signal potential for the other row to the gate of the driving transistor 41 and bring the driving transistor 41 into conduction, and then setting the power line 80 to the third potential while the driving transistor 41 is conducting. In the writing step, a signal voltage is written to the storage capacitor 42 by bringing the switching transistor 43 into conduction while the power line 80 is set to the third potential and the data line 70 is set to the signal potential corresponding to the pixel.

Accordingly, it is possible to write an appropriate signal voltage to the storage capacitor and to cause the organic EL device 40 to emit light at the desired luminance. Thus, unevenness in display of the display area 2 can be suppressed.

Embodiment 3

The following describes an organic EL display device and a method for driving the organic EL display device according to Embodiment 3.

The present embodiment is identical to Embodiment 1 in the configuration of the organic EL display device and the configuration of pixels, and differs in the operations of driving the organic EL display device. Thus, the following description focuses mainly on the driving operations, and description of constituent elements will be omitted.

Figure 9:
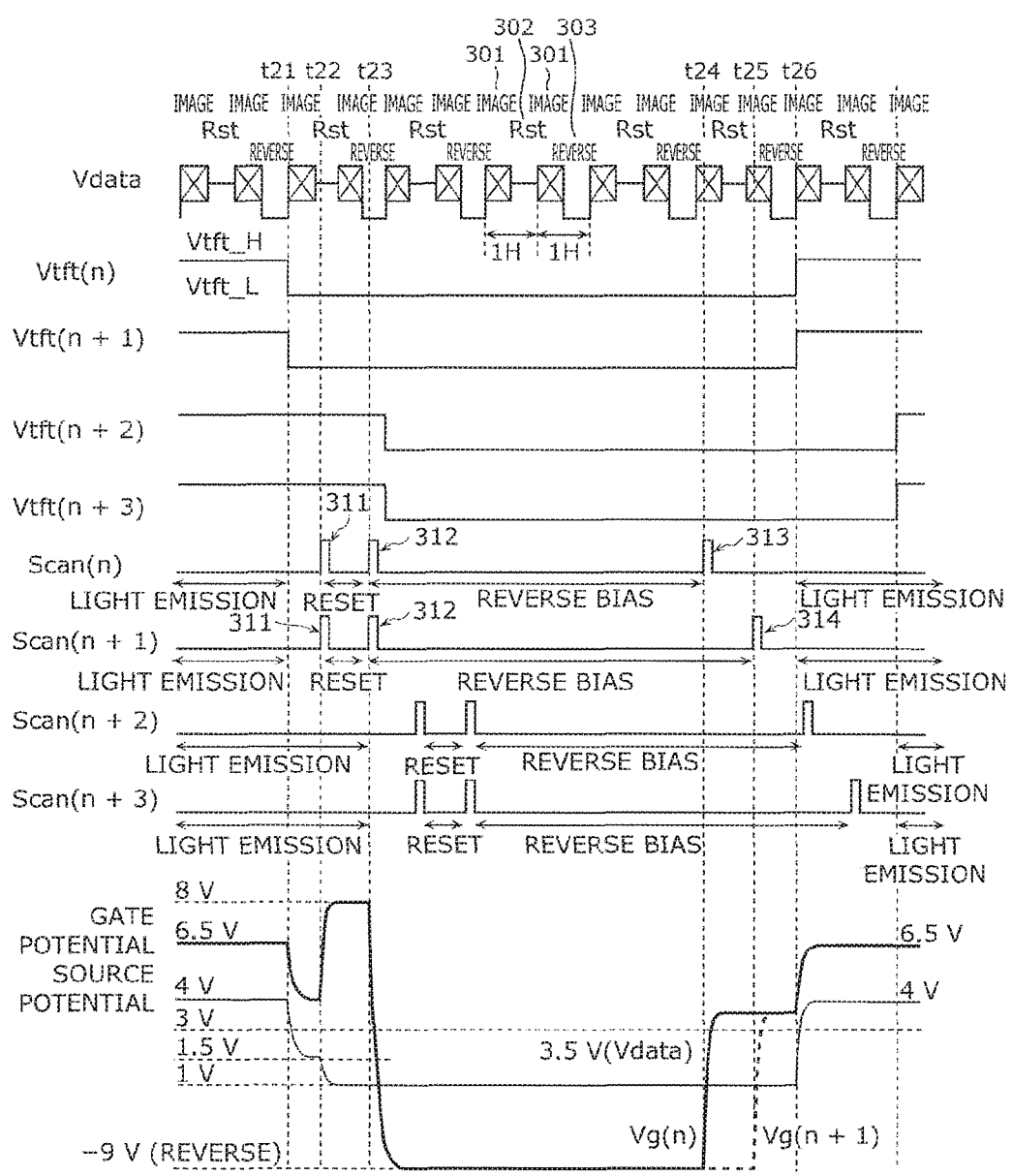
FIG. 9 is a timing chart illustrating operations of a pixel in an organic EL display device according to Embodiment 3.

FIG. 9 is a timing chart illustrating operations of a pixel 4 in the organic EL display device 1 according to the present embodiment.

More specifically, FIG. 9 illustrates a potential "Vdata" supplied to the data line 70, potentials "Vtft(n)," "Vtft(n+1)," "Vtft(n+1)," and "Vtft(n+3)" that are set to each row of the power lines 80, scan signals "Scan(n)," "Scan(n+1)," "Scan(n+2)," and "Scan(n+3)" that are supplied to each row of the scanning lines 60, the gate potential (bold solid line) of the driving transistor 41, and the source potential (thin solid line) of the driving transistor 41 from the top in the stated order. For example, the potentials Vtft(n) to Vtft(n+3) respectively indicate the potentials supplied to the power lines 80 of the n-th to (n+3)-th rows, and the scan signals Scan(n) to Scan(n+3) respectively indicate the scan signals supplied to the scanning lines 60 of the n-th to (n+3)-th rows.

As illustrated in FIG. 9, the data line 70 is sequentially set to a signal potential ("IMAGE" in FIG. 9) for each row of the pixels 4 at an interval of one horizontal period (1H). One horizontal period includes a first period 301 during which the data line 70 is set to the signal potential. One of two continuous horizontal periods includes a second period 302 during which the data line 70 is set to the reset potential, and the other of the two continuous horizontal periods includes a third period 303 during which the data line 70 is set to the reverse bias potential. That is, two horizontal periods make a single repetition unit. That is, the data-line drive circuit 7 in the present embodiment drives the data lines 70 at a frequency that is twice of one horizontal frequency (1/1H).

The voltage control circuit 8 sets the potentials of the power lines 80 for each two rows of power lines 80. More specifically, the power lines 80 of the n-th and (n+1)-th rows are set to the same potential at the same timing, as indicated by Vtft(n) and Vtft(n+1). The same applies to the power lines 80 of the (n+2)-th and (n+3)-th rows.

The scanning-line drive circuit 6 supplies a writing scan signal to each row at different timings (more specifically, the timing is shifted by one horizontal period). For example, the scan signal 313 is supplied to the scanning line 60 of the n-th row, and after an elapse of one horizontal period, the scan signal 314 is supplied to the scanning line 60 of the (n+1)-th row, as indicated by Scan(n) and Scan(n+1).

On the other hand, the scanning-line drive circuit 6 supplies a reset scan signal and a reverse-bias-application scan signal to each two rows at different timings (more specifically, for example, the timing of supplying the reset scan signal and the timing of supplying the reverse-bias-application scan signal are shifted by one horizontal period). The same applies to the reverse-bias-application scan signal. For example, the reset scan signal 311 is supplied to the scanning lines 60 of the n-th and (n+1)-th rows at the same timing, and the reverse bias application scan signal 312 is supplied to the scanning lines 60 of the n-th and (n+1)-th rows at the same timing, as indicated by Scan(n) and Scan(n+1). The same applies to the (n+2)-th and (n+3)-th scan signals.

The following describes operations of pixels 4, focusing on the n-th and (n+1)-th rows. State transition diagrams of the circuit of the pixels 4 are identical to those in FIGS. 4A and 4B, and therefore description of operations that are identical to those in Embodiment 1 will be either simplified or omitted.

[Light Emission Period (Until Time t21)]

In the light emission period (until time t21) illustrated in FIG. 9, since the power lines 80 are set to Vtft_H as indicated by Vtft(n) and Vtft(n+1), current corresponding to the signal voltages held by the storage capacitors 42 flows and causes the organic EL devices 40 to emit light (see (a) in FIG. 4A). At this time, light is emitted from the organic EL devices 40 of the pixels 4 of the n-th row and the organic EL devices 40 of the pixels 4 of the (n+1)-th row.

[Discharge Period (from Time t21 to t22)]

At time t21, the power lines 80 are set to Vtft_L as indicated by Vtft(n) and Vtft(n+1) to end the light emission of the organic EL devices 40. Simultaneously with the end of the light emission, charge is discharged from the storage capacitors 42 through the sources and drains of the driving transistors 41 into the power lines 80. The electric discharge causes a drop in the potentials across the storage capacitors 42 and causes the driving transistors 41 to have a gate potential of 4V and a source potential of 1.5V (see (b) in FIG. 4A). After two horizontal periods have elapsed since the end of the light emission period (time t21) for the n-th and (n+1)-th rows, the light emission period for the (n+2)-th and (n+3)-th rows end.

[Capacitance Reset Period (from Time t22 to t23)]

At time t22, a reset potential (more specifically, 8V) is supplied to the gates of the driving transistors 41 by supplying the scan signal 311 to the scanning lines 60 to bring the switching transistors 43 into conduction. This provides continuity between the sources and drains of the driving transistors 41 and causes the charge remaining in the storage capacitors 42 and the parasitic capacitances of the organic EL devices 40 to be discharged into the power lines 80. Thus, the source potentials of the driving transistors 41 can be set to be the same as the potentials (more specifically, 1V) of the power lines 80 (see (c) and (d) in FIG. 4A). While the reset period (from time t22 to t23) corresponds to approximately one horizontal period, the present disclosure is not limited to this example. The length of the reset period may be set to allow sufficient discharge time according to, for example, the magnitudes of the storage capacitors 42 and the parasitic capacitances of the organic EL devices 40.

[Reverse-Bias Application Period (from Time t23 to t24)]

At time t23, a reverse bias potential (more specifically, −9V) is supplied to the gates of the driving transistors 41 by supplying the scan signal 312 to the scanning lines 60 to bring the switching transistors 43 into conduction. Accordingly, a reverse bias voltage (more specifically, −10V) is supplied between the gates and sources of the driving transistors 41 (see (e) and (f) in FIG. 4B).

While, as illustrated in FIG. 9, the light emission period for the (n+2)-th and (n+3)-th rows end during the reverse-bias application period for the n-th and (n+1)-th rows, the present disclosure is not limited to this example. More specifically, a case is also conceivable in which the light emission period for the (n+2)-th and (n+3)-th rows may end during the capacitance reset period, depending on the length of the reset period (from time t22 to t23).

[Writing of Signal Voltage (Times t24 and t25)

At time t24, a signal voltage is written to the storage capacitors 42 of the n-th row by supplying the scan signal 313 to the scanning line 60 of the n-th row as indicated by Scan(n) in FIG. 9 (see (g) in FIG. 4B). Then, at time t25, a signal voltage is written to the storage capacitors 42 of the (n+1)-th row by supplying the scan signal 314 to the scanning line 60 of the (n+1)-th row.

In the present embodiment, a signal voltage needs to be written on a row-by-row basis because the data line 70 is provided for each column. In other words, it is not possible to write signal voltages to the storage capacitors 42 of multiple rows at the same time, and therefore the timing of writing a signal voltage is shifted between the n-th row and the (n+1)-th row.

[Light Emission Period (from Time t26)]

At time t26, current is supplied from the power lines 80 through the driving transistors 41 to the organic EL devices 40 by setting the power lines 80 to Vtft_H as indicated by Vtft(n) and Vtft(n+1) in FIG. 9 (see (h) in FIG. 4B). Accordingly, current corresponding to the signal voltages (e.g., 2.5V) held by the storage capacitors 42 flows and causes the organic EL devices 40 to emit light. At this time, the organic EL devices 40 of the pixels 4 of the n-th row and the organic EL devices 40 of the pixels 4 of the (n+1)-th row emit light at the same time.

As described above, in the present embodiment, the data lines 70 are sequentially set to signal potentials for each row of pixels 4 at an interval of one horizontal period. Two continuous horizontal periods each include the first period 301 during which the data line 70 is set to the signal potential, one of the two horizontal periods further includes the second period 302 during which the data line 70 is set to the reset potential, and the other of the two horizontal periods further Includes the third period 303 during which the data line 70 is set to the reverse bias potential.

In the present embodiment, the data lines 70 are driven at a frequency that is twice of one horizontal frequency (1/1H). That is, the data lines 70 are driven at double speed.

Thus, the voltage control circuit 8 may drive the power lines 80 by using two values, namely, the first potential and the second potential, and the data-line drive circuit 7 may drive the data lines 70 at double frequency. Accordingly, power consumption can be suppressed as compared to the case of driving the data lines 70 at three-times frequency. In addition, the voltage control circuit 8 can be implemented by a simple configuration, as compared to the case of using three values to drive the power lines 80, and as a result, an increase in cost can be suppressed.

While the voltage control circuit 8 in the present embodiment sets the potentials of the power lines 80 for each two rows, the potentials of the power lines 80 may be set for each m rows (m is a natural number of 2 or more), e.g., for each three rows or for each four rows. More specifically, the power lines 80 of the n-th to (n+m−1)-th rows are set to the same potential at the same timing, as indicated by Vtft(n) to Vtft(n+m−1). In this case, the n-th to (n+m−1)-th rows are processed simultaneously during the discharge period, the capacitance reset period, the reverse-bias application period, and the light emission period, excluding the signal-voltage writing period. That is, in the present embodiment, multiple rows may be processed simultaneously in the light emission step, the reset step, and the reverse-bias application step.

This allows the voltage control circuit 8 to control the power lines 80 of multiple rows at once, thus reducing the circuit scale. That is, the voltage control circuit 8 can be implemented by a simple configuration, as compared with the case of driving the power lines 80 on a row-by-row basis, and as a result, an increase in cost can be suppressed.

Embodiment 4

The following describes an organic EL display device and a method for driving the organic EL display device according to Embodiment 4.

The present embodiment is identical to Embodiment 1 in the configuration of the organic EL display device and the configuration of pixels, and differs in the operations of driving the organic EL display device. Thus, the following description focuses mainly on the driving operations, and description of constituent elements will be omitted.

The present embodiment differs from Embodiment 1 in that the step of detecting the threshold voltages of the driving transistors 41 is added to the operations described in Embodiment 1.

Figure 10:
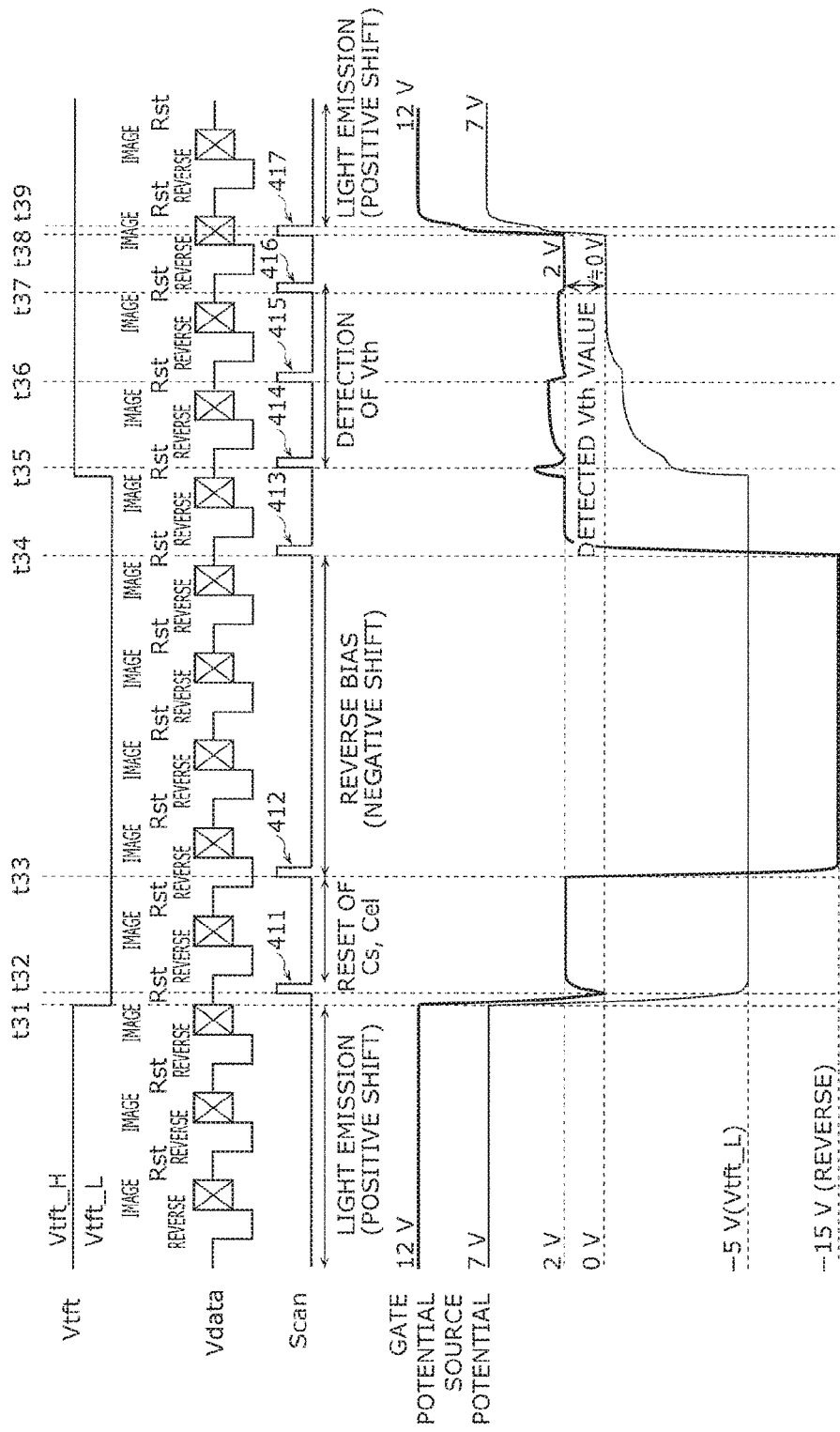
FIG. 10 is a timing chart illustrating operations of a pixel in an organic EL display device according to Embodiment 4.
Figure 11A:
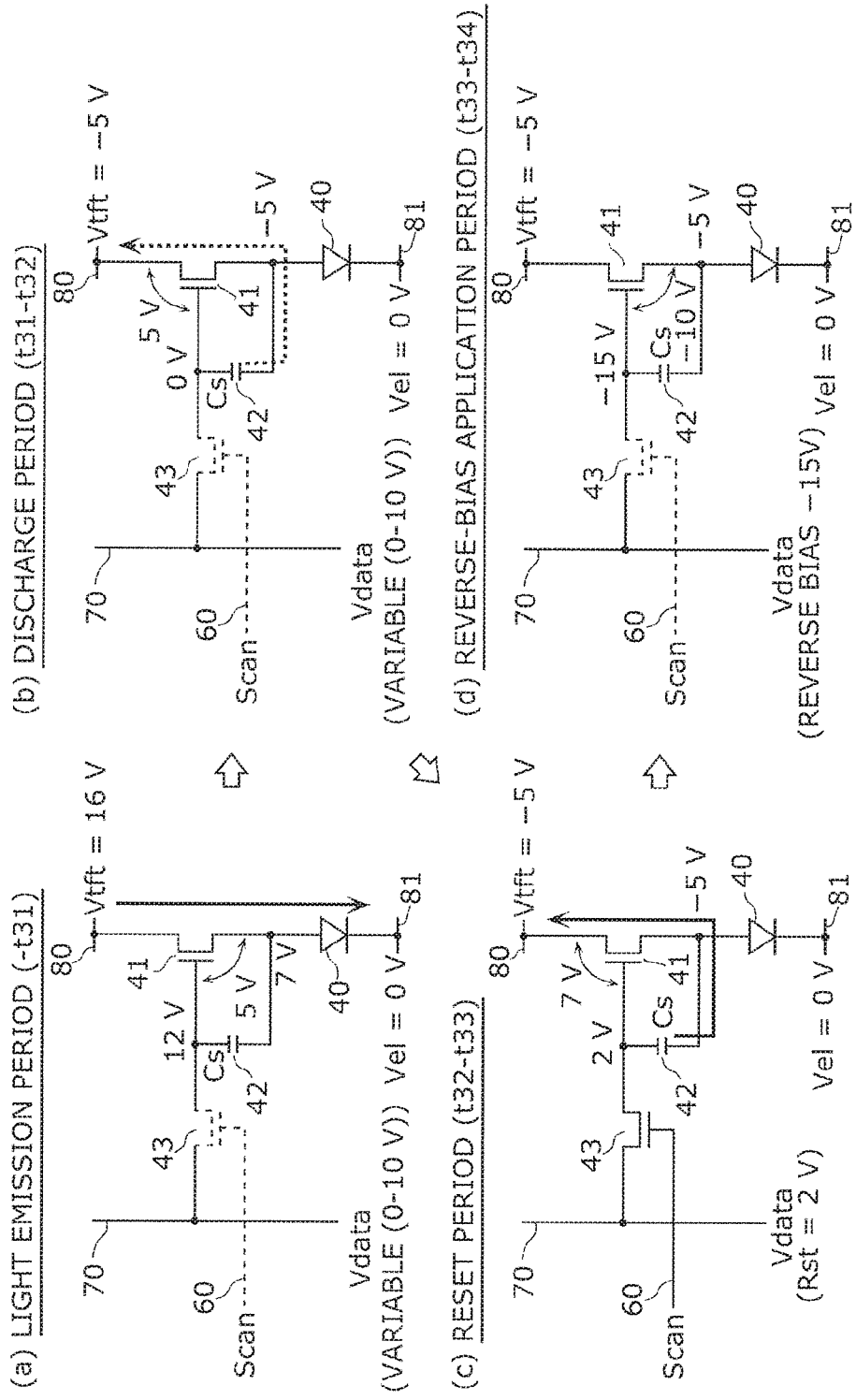
FIG. 11A is a state transition diagram illustrating the operations of the pixel in the organic EL display device according to Embodiment 4.
Figure 11B:
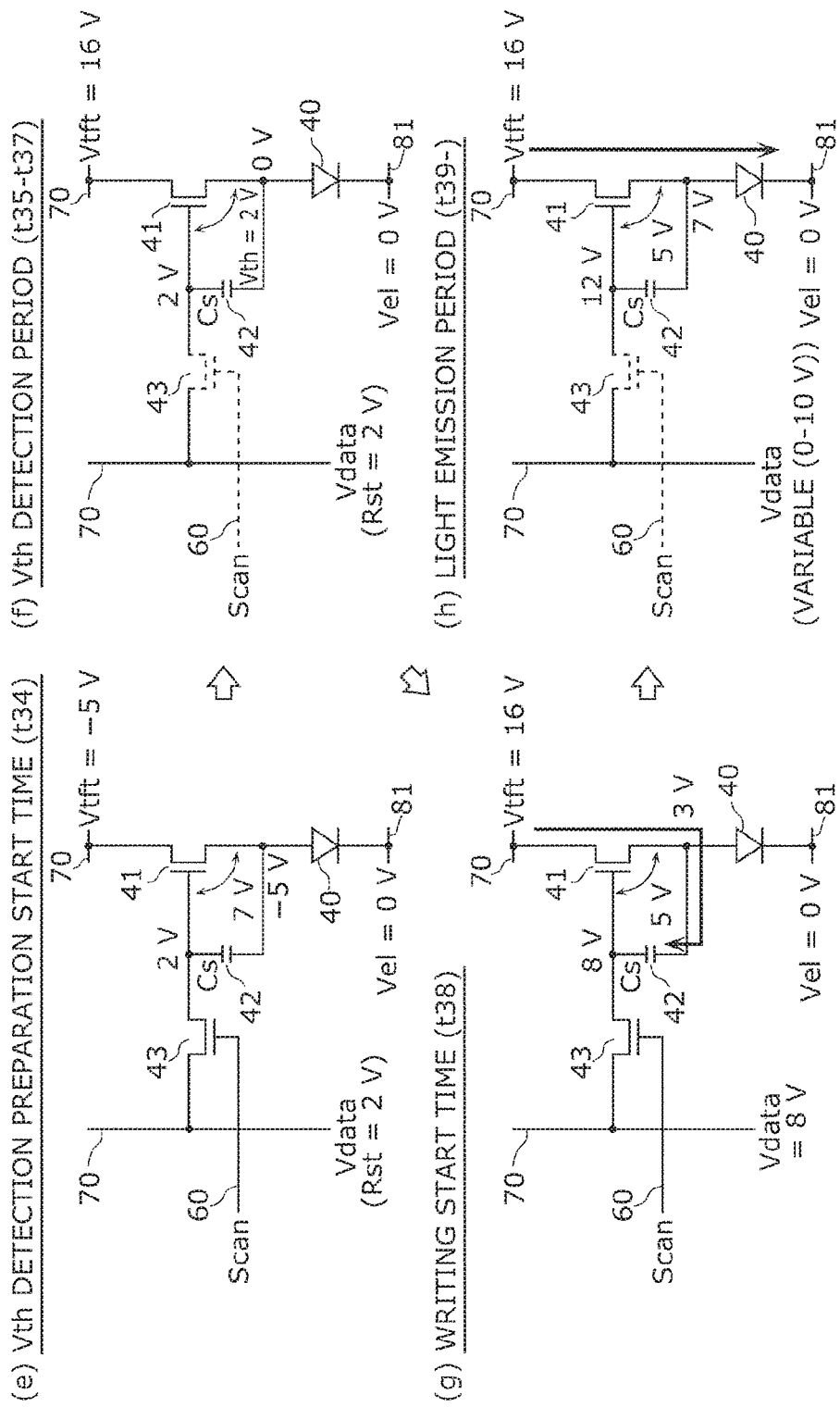
FIG. 11B is a state transition diagram illustrating the operations of the pixel in the organic EL display device according to Embodiment 4.

FIG. 10 is a timing chart illustrating operations of a pixel 4 in the organic EL display device 1 according to the present embodiment. FIGS. 11A and 11B are state transition diagrams illustrating the operations of the pixel 4 in the organic EL display device 1 according to the present embodiment.

More specifically, FIG. 10 illustrates a potential "Vtft" supplied to the power line 80, a potential "Vdata" supplied to the data line 70, a scan signal "Scan" supplied to the scanning line 60, the gate potential (bold solid line) of the driving transistor 41, and the source potential (thin solid line) of the driving transistor 41 from the top in the stated order.

The power line 80 is selectively set to a first potential Vtft_H or a second potential Vtft_L. More specifically, the power line 80 is set to Vtft_H during the light emission period and a threshold-value detection period and set to Vtft_L during the non-light emission period, excluding the threshold-value detection period.

The timing of driving the data line 70 is the same as in Embodiment 1.

[Light Emission Period (Until Time t31)]

In the light emission period (until time t31) illustrated in FIG. 10, since the power line 80 is set at Vtft_H, current corresponding to the signal voltage (e.g., 5V) held by the storage capacitor 42 flows through the driving transistor 41 to the organic EL device 40 as illustrated in (a) in FIG. 11A. Accordingly, the organic EL device 40 emits light at a high luminance. At this time, the anode potential of the organic EL device 40 (i.e., the source potential of the driving transistor 41) is 7V, and the gate potential of the driving transistor 41 is 12V.

[Discharge Period (from Time t31 to t32)]

At time t31, the power line 80 is set to Vtft_L to end the light emission of the organic EL device 40. For example, Vtft_L is −5V.

At time t31, the driving transistor 41 has a gate potential of 12V and a drain potential of 1V. Thus, the driving transistor 41 is conducting, and the signal voltage held by the storage capacitor 42 is discharged through the driving transistor 41 into the power line 80. The electric discharge causes a drop in the potential across the storage capacitor 42 and causes the driving transistor 41 to have a gate potential of 0V and a source potential of −5V as illustrated in (b) in FIG. 11A.

[Capacitance Reset Period (from Time t32 to t33)]

At time t32, a reset potential is supplied to the gate of the driving transistor 41 by supplying a scan signal 411 to the scanning line 60 to bring the switching transistor 43 into conduction as illustrated in (c) in FIG. 11A. At this time, the power line 80 is set at Vtft_L, and the data line 70 is set at the reset potential (more specifically, 2V).

At this time, the 7V voltage is applied between the gate and drain of the driving transistor 41, and this provides continuity between the source and drain of the driving transistor 41. However, the charge held in the storage capacitor 42 and the parasitic capacitance of the organic EL device 40 has already been discharged into the power line 80 during the discharge period (from time t31 to t32). Thus, in actuality, there is no flow of charge during the reset period, and the source potential of the driving transistor 41 remains at Vtft_L(−5V).

That is, there is no need to provide a reset period because the storage capacitor 42 and the parasitic capacitance of the organic EL device 40 are reset as in Embodiment 1. However, it is unclear what gradation level of signal voltage will be written to each pixel 4. Thus, the reset period is still necessary in order to reliably reset the storage capacitor 42 and the parasitic capacitance of the organic EL device 40.

[Reverse-Bias Application Period (from Time t33 to t34)]

At time t33, a reverse bias potential is supplied to the gate of the driving transistor 41 by supplying a scan signal 412 to the scanning line 60 to bring the switching transistor 43 into conduction as illustrated in (d) in FIG. 11A. At this time, the power line 80 is set at Vtft_L, and the data line 70 is set at the reverse bias potential (more specifically, −15V).

More specifically, a reverse bias voltage of −10V is applied between the gate and source of the driving transistor 41 as illustrated in (d) in FIG. 11A. It is thus possible to suppress time-varying fluctuations in the threshold voltage of the driving transistor 41.

[Preparation for Detection of Threshold Voltage (Time t34)]

At time t34, a reset potential (more specifically, 2V) is supplied to the gate of the driving transistor 41 by supplying a scan signal 413 to the scanning line 60 to bring the switching transistor 43 into conduction as illustrated in (e) in FIG. 11B. Accordingly, a voltage greater than or equal to the threshold voltage is applied between the gate and source of the driving transistor 41 to bring the driving transistor 41 into conduction. As a result, the source potential of the driving transistor 41 is set to −5V, which is the same as the potential of the power line 80.

[Threshold-Voltage Detection Period (from Time t35 to t37)]

At time t35, a scan signal 414 is supplied to the scanning line 60 to bring the switching transistor 43 into condition while the power line 80 is set at Vtft_H and the data line 70 is set at the reset potential, as illustrated in (f) in FIG. 11B. Accordingly, a voltage greater than or equal to the threshold voltage is applied between the gate and source of the driving transistor 41 to bring the driving transistor 41 into conduction, and charge is supplied from the power line 80 to the storage capacitor 42.

In the present example, the scan signals 414 to 416 are supplied multiple times, more specifically, three times including times t35, t36, and t37, as illustrated in FIG. 10. This allows the storage capacitor 42 to hold the threshold voltage of the driving transistor 41. Note that the number of times the scan signal is supplied is not limited to this example, and a scan signal may be supplied only once.

[Writing of Signal Voltage (Time t38)]

At time t38, a signal voltage is written to the storage capacitor 42 by supplying a scan signal 417 to the scanning line 60 to bring the switching transistor 43 into conduction as illustrated in (g) in FIG. 11B. At this time, the power line 80 is set at Vtft_H, and the data line 70 is set at the signal potential.

At this time, current corresponding to the signal voltage and the mobility of the driving transistor 41 flows from the power line 80 to the storage capacitor 42, and accordingly the signal voltage written to the storage capacitor 42 fluctuates according to the current flowing into the storage capacitor 42. That is, the mobility can be corrected.

[Light Emission Period (from Time t39)]

After the switching transistor 43 is brought out of conduction, current is supplied from the power line 80 through the driving transistor 41 to the organic EL device 40 at time t39 as illustrated in (h) in FIG. 11B. Accordingly, current corresponding to the signal voltage (e.g., 5V) held by the storage capacitor 42 flows and causes the organic EL device 40 to emit light.

As described above, the method for driving the organic EL display device 1 according to the present embodiment further includes a threshold-value detection step of detecting the threshold voltage of the driving transistor 41 after the reverse-bias application step By detecting the threshold voltage of the driving transistor 41, an appropriate signal voltage can be written to the storage capacitor 42. It is thus possible to suppress, for example, unevenness in display of the display area 2.

Embodiment 5

The following describes an organic EL display device and a method for driving the organic EL display device according to Embodiment 5.

The present embodiment is identical to Embodiment 1 in the configuration of the organic EL display device and the configuration of the pixels, and differs in the operations of driving the organic EL display device. Thus, the following description focuses mainly on the driving operations, and description of constituent elements will be omitted.

Embodiments 1 to 4 described above take the example of the case where the reverse bias voltage is a constant value. The application of the reverse bias voltage causes a negative shift of the threshold voltage. Using this feature, Embodiments 1 to 4 described above suppress time-varying fluctuations in the threshold voltage by causing the threshold voltage shifted in the positive direction during the light emission period to be shifted in the negative direction.

However, if the reverse bias voltage is applied too much, the threshold voltage may be shifted too much in the negative direction depending on the cases. For example, if a constant reverse bias voltage of −10V continues to be applied to a pixel that is almost a black pixel with a positive bias of nearly 0V, the threshold voltage of the driving transistor 41 may be shifted in the negative direction. Such a negative shift of the threshold voltage may cause the pixel to emit light at a higher luminance than surrounding pixels do, resulting in reverse burn-in.

In view of this, in the present embodiment, the reverse bias voltage is determined in accordance with the signal voltage (i.e., positive bias voltage).

By applying a negative bias voltage corresponding to the positive bias voltage, fluctuations in the threshold value of the driving transistor 41 can be suppressed properly. That is, it is possible to prevent the threshold value from being shifted too much in the negative direction.

Figure 12:
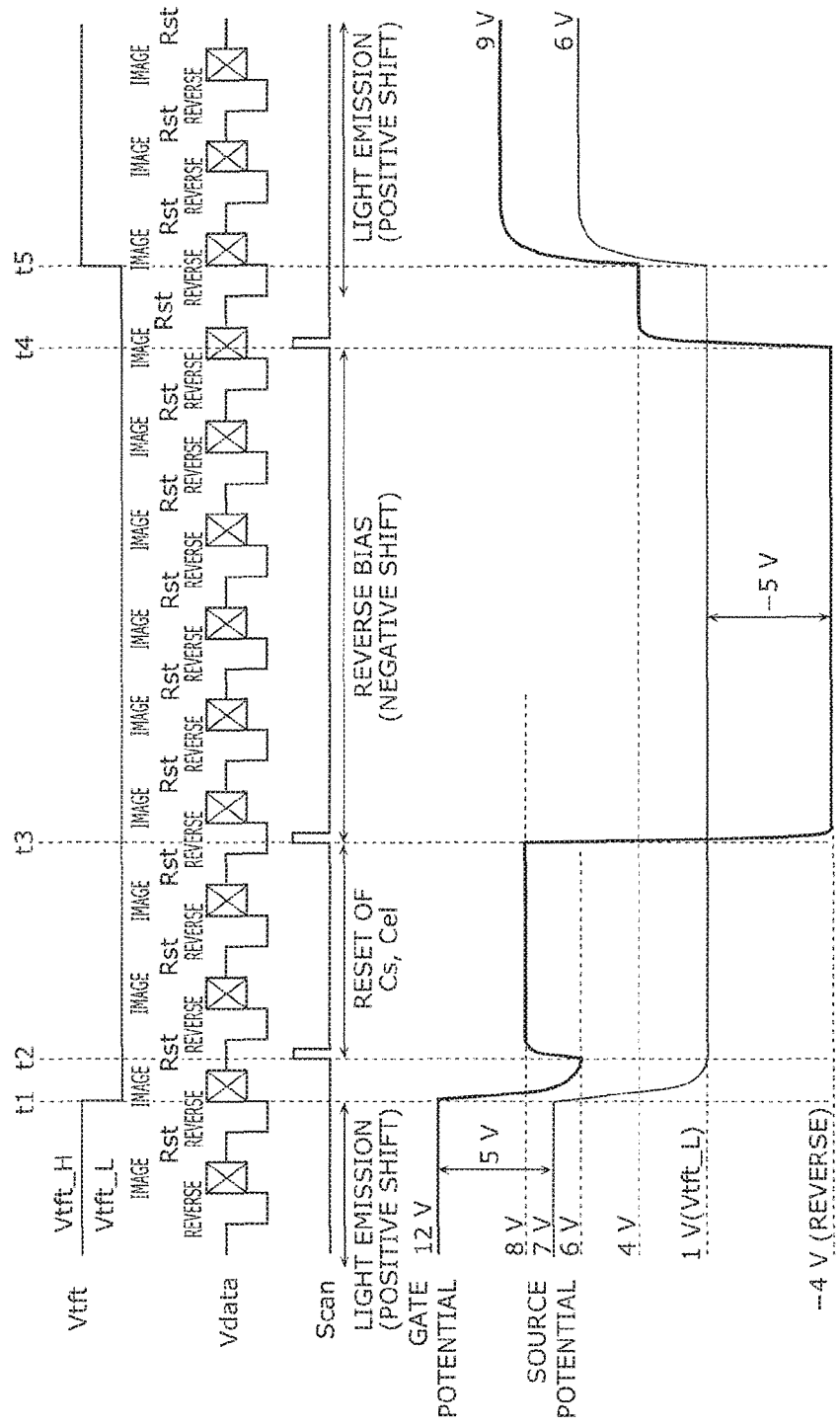
FIG. 12 is a timing chart illustrating operations of a pixel during high-gradation light emission in an organic EL display device according to Embodiment 5.
Figure 13:
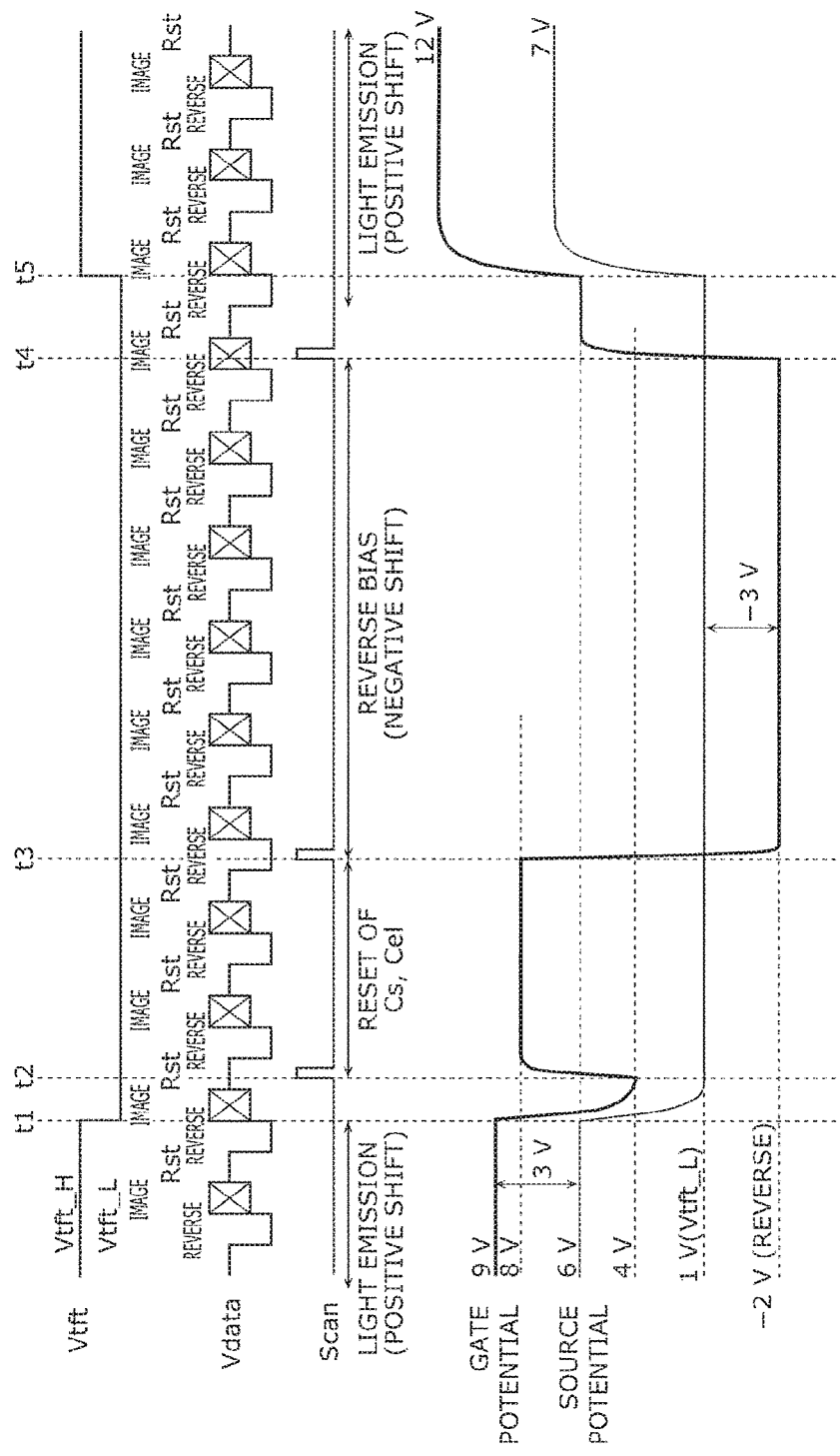
FIG. 13 is a timing chart illustrating operations of a pixel during low-gradation light emission in the organic EL display device according to Embodiment 5.

FIG. 12 is a timing chart illustrating operations of a pixel 4 during high-gradation light emission in the organic EL display device 1 according to the present embodiment. FIG. 13 is a timing chart illustrating operations of a pixel 4 during low-gradation light emission in the organic EL display device 1 according to the present embodiment.

In the example illustrated in FIG. 12, the gate potential is set at 12V and the source potential is set at 7V before time t1. Thus, the organic EL device 40 emits light while the storage capacitor 42 holds a signal voltage of 5V. In this case, in the reverse-bias application period from time t3 to t4, a reverse bias voltage of −5V is applied between the gate and source of the driving transistor 41 because the gate potential is set at −4V and the source potential is set at 1V.

In the example illustrated in FIG. 13, the gate potential is set at 9V and the source potential is set at 6V before time t1. Thus, the organic EL device 40 emits light while the storage capacitor 42 holds a signal voltage of 3V. In this case, in the reverse-bias application period from time t3 to t4, a reverse bias voltage of −3V is applied between the gate and source of the driving transistor 41 because the gate potential is set at −2V and the source potential is set at 1V.

As described above, in the present embodiment, the reverse bias voltage is determined on the basis of the signal voltage supplied to a corresponding pixel 4.

More specifically, the reverse bias voltage has a positive correlation with the signal voltage supplied to a corresponding pixel. For example, the reverse bias voltage to be supplied increases as the signal voltage supplied to a corresponding pixel Increases.

The signal voltage as used herein refers to, for example, a signal voltage for a previous frame immediately before the application of the reverse bias voltage as illustrated in FIGS. 12 and 13. In this case, the organic EL display device 1 includes a memory for storing the signal voltage for the previous frame.

Alternatively, the signal voltage may be a signal voltage for a frame immediately after the application of the reverse bias voltage. In this case, the organic EL display device 1 does not need to include a memory for storing the signal voltage, and cost can be reduced.

While FIGS. 12 and 13 take the example of the case where the absolute value of the reverse bias voltage is equal to the absolute value of the signal voltage, the present disclosure is not limited to this example. For example, the reverse bias voltage may be set in stages for each range of signal voltage. That is, the reverse bias voltage may be set to multiple discrete values.

For example, consider a case where the signal voltage is in the range of 0V to 10V. In this case, the reverse bias voltage for a signal voltage in the range of 0V to 3V may be set to −2V, the reverse bias voltage for a signal voltage in the range of 3V to 7V may be set to −5V, and the reverse bias voltage for a signal voltage in the range of 7V to 10V may be set to −10V. This reduces the number of bits of the data-line drive circuit 7.

Other Embodiments

As described above, embodiments are described by way of example of the technique disclosed in the present application. The technique of the present disclosure is, however, not limited to these embodiments and is also applicable to other embodiments obtained by appropriate modifications, replacements, addition, and omission. New embodiments may also be derived from any combination of constituent elements described in the above embodiments.

The following describes other exemplary embodiments.

While the above embodiments describe the organic EL display device 1 that includes the organic EL devices 40 as light emitting devices by way of example of the display device according to the present disclosure, the present disclosure is not limited to this example. The display device may be any display device that includes current-driven light emitting devices.

The circuit configuration of the pixels 4 in the display device according to the present disclosure is not limited to the above-described circuit configuration, and may be other configurations. The operations of the pixels 4 are not limited to those illustrated in the above-described timing charts, and may be other operations. Each transistor in the pixels 4 may be either a P-channel type transitory or an N-channel type transistor.

The present disclosure also includes configurations obtained by connecting other devices such as transistors, resistance elements, and capacitance elements in series or in parallel to any given device, within the range that allows implementation of functions similar to those achieved by the above-described circuit configurations. In other words, the language "connected" as used in the above-described embodiments is not limited to the case where two terminals (nodes) are directly connected to each other, but also includes cases where these two terminals (nodes) are connected via another/other device(s), within the range that allows implementation of similar functions.

The numeric values used in the above description are merely examples used to specifically describe the present disclosure, and the present disclosure is not limited to such exemplary numeric values.

While the above-described embodiments take the example of the case where the pixels 4 have a so-called "2Tr1C" circuit configuration, the present disclosure is not limited to this example. For example, the pixels 4 may include other devices such as a reset transistor for resetting the charge of the storage capacitor 42 and the parasitic capacitance of the organic EL device 40.

The present disclosure may be implemented as a program for causing a computer to function as a distinctive controller included in the display device, or as a program for causing a computer to execute a distinctive step included in the driving method. Moreover, it goes without saying that such a program may be distributed via non-transitory computer-readable recording media such as compact disc-read only memories (CR-ROMs) or via communication networks, including the Internet.

As described above, embodiments are described by way of example of the technique according to the present disclosure. Attached drawings and detailed descriptions are provided to describe the embodiments.

Thus, the constituent elements described in the detailed descriptions with reference to the attached drawings may include not only essential constituent elements necessary to solve the problem but also constituent elements that are not essential to solve the problem, in order to illustrate the above-described technique. Therefore, such unessential constituent elements listed in the attached drawings or the detailed descriptions should not immediately be regarded as essential constituent elements.

The above-described embodiments are merely illustrative examples of the technique according to the present disclosure, and various modifications, replacement, addition, and omission are possible within the scope of claims or within the equivalent range of the claims.

INDUSTRIAL APPLICABILITY

Figure 14:
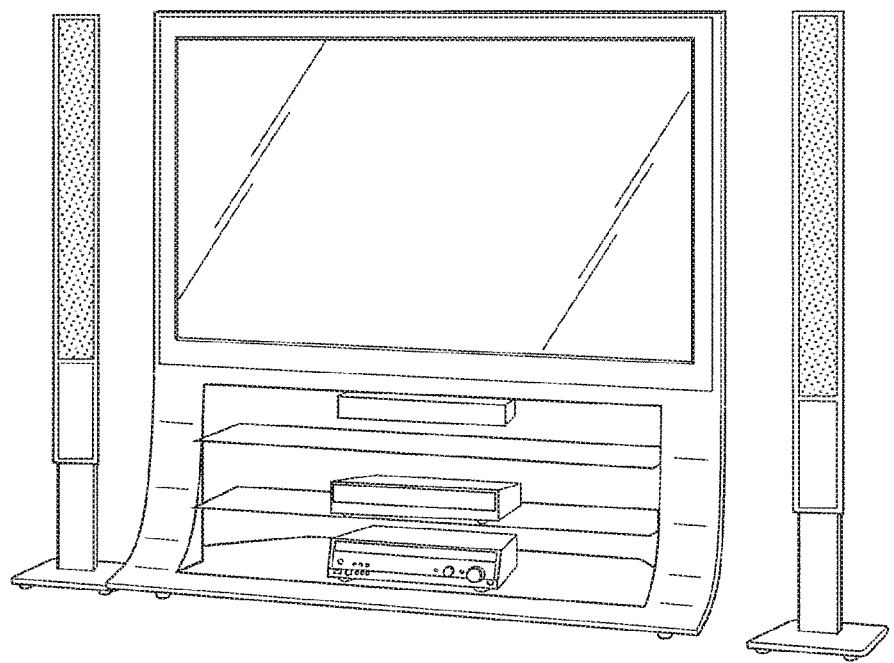
FIG. 14 is an external view of a low-profile, flat TV with a built-in display device of the present disclosure.

The display device and the method for driving the display device according to the present disclosure can be used as display devices such as a flat panel display device of a TV as illustrated in FIG. 14.

The invention claimed is:

1. A method for driving a display device including a plurality of pixels arranged in rows and columns,
   each of the plurality of pixels including:
   a light emitting device that emits light in accordance with supplied current;
   a driving transistor that supplies current to the light emitting device;
   a single storage capacitor connected between a gate of the driving transistor and a source or drain of the driving transistor; and
   a switching transistor connected between the gate of the driving transistor and a data line, wherein a first electrode of the storage capacitor is connected only to the gate of the driving transistor and a source or drain of the switching transistor,
wherein a second electrode of the storage capacitor is connected only to an anode of the light emitting device and the source or drain of the driving transistor, and
wherein a node between the gate of the driving transistor and the source or drain of the switching transistor is connected only to the first electrode of the storage capacitor, the gate of the driving transistor and the source or drain of the switching transistor,
the method comprising:
causing the light emitting device to emit light by supplying current to the light emitting device during a light emission period;
resetting charge of at least one of the storage capacitor and a parasitic capacitance of the light emitting device during a reset period; and
applying a reverse bias voltage between the gate and source of the driving transistor during a reverse-bias application period,
wherein the resetting is performed between the light emission and the reverse-bias application, and
wherein a gate potential voltage during the reverse-bias application period is lower than a gate potential voltage during the light emission period.

2. The method according to claim 1,
wherein the display device further includes:
a power line connected to the drain or source of the driving transistor of each of the plurality of pixels,
wherein the data line is provided for each of the columns of the plurality of pixels, and
wherein, in the resetting, the charge of at least one of the storage capacitor and the parasitic capacitance is discharged into the power line by bringing the switching transistor into conduction to supply a reset potential from the data line to the gate of the driving transistor and to bring the driving transistor into conduction.

3. The method according to claim 2,
wherein the power line is selectively set to a first potential or a second potential lower than the first potential,
the data line is selectively set to one of a plurality of potentials including a signal potential corresponding to a pixel signal,
in the light emission, the current is supplied from the power line through the driving transistor to the light emitting device by setting the power line to the first potential,
in the resetting, the reset potential is supplied to the gate of the driving transistor by bringing the switching transistor into conduction while the power line is set to the second potential and the data line is set to the reset potential, and
in the reverse-bias application, the reverse bias voltage is applied by bringing the switching transistor into conduction to supply the reverse bias potential to the gate of the driving transistor, while the power line is set to the second potential and the data line is set to the reverse bias potential.

4. The method according to claim 3,
wherein the reset potential is a predetermined potential independent of the signal potential.

5. The method according to claim 4,
wherein the data line is sequentially set to the signal potential for each row of the plurality of pixels at an interval of one horizontal period, and the one horizontal period includes:
a first period during which the data line is set to the signal potential;
a second period during which the data line is set to the reset potential; and
a third period during which the data line is set to the reverse bias potential.

6. The method according to claim 5,
wherein the data line is driven at a frequency that is three times one horizontal frequency.

7. The method according to claim 4,
wherein the data line is sequentially set to the signal potential for each row of the plurality of pixels at an interval of one horizontal period,
two continuous horizontal periods each include a first period during which the data line is set to the signal potential,
one of the two continuous horizontal periods further includes a second period during which the data line is set to the reset potential, and
the other of the two continuous horizontal periods further includes a third period during which the data line is set to the reverse bias potential.

8. The method according to claim 7,
wherein the data line is driven at a frequency that is twice of one horizontal frequency.

9. The method according to claim 8,
wherein the light emission, the resetting, and the reverse-bias application for a plurality of rows are performed simultaneously.

10. The method according to claim 3,
wherein the reset potential is the signal potential for another row.

11. The method according to claim 10,
wherein the power line is further selectively set to a third potential that is lower than the first potential and higher than the second potential,
the method further comprising:
in preparation for writing, setting the source and drain of the driving transistor to the third potential by first bringing the switching transistor into conduction, while the power line is set at the second potential and the data line is set at the signal potential for the other row, to supply the signal potential for the other row to the gate of the driving transistor and bring the driving transistor into conduction, and then setting the power line to the third potential while the driving transistor is conducting; and
writing a signal voltage to the storage capacitor by bringing the switching transistor into conduction while the power line is set to the third potential and the data line is set to the signal potential corresponding to the pixel.

12. The method according to claim 1, further comprising detecting a threshold voltage of the driving transistor after the reverse-bias application.

13. The method according to claim 1,
wherein the reverse bias voltage is determined on the basis of a signal voltage supplied to a corresponding pixel.

14. The method according to claim 1,
wherein a gate potential voltage during the reset period is higher than the gate potential voltage during the reverse-bias application period.

15. A display device including a plurality of pixels arranged in rows and columns, each of the plurality of pixels including:
a light emitting device that emits light in accordance with supplied current;
a driving transistor that supplies current to the light emitting device;
a single storage capacitor connected between a gate of the driving transistor and a source or drain of the driving transistor, and
a switching transistor connected between the gate of the driving transistor and a data line,
wherein a first electrode of the storage capacitor is connected only to the gate of the driving transistor and a source or drain of the switching transistor,
wherein a second electrode of the storage capacitor is connected only to an anode of the light emitting device and the source or drain of the driving transistor, and
wherein a node between the gate of the driving transistor and the source or drain of the switching transistor is connected only to the first electrode of the storage capacitor, the gate of the driving transistor and the source or drain of the switching transistor, the display device comprising:
a controller that (i) causes the light emitting device to emit light by supplying current to the light emitting device during a light emission period, (ii) reset charge of at least one of the storage capacitor and a parasitic capacitance of the light emitting device during a reset period, and (iii) applies a reverse bias voltage between the gate and source of the driving transistor during a reverse-bias application period,
wherein the reset period is between the light emission period and the reverse-bias application period, and
wherein a gate potential voltage during the reverse-bias application period is lower than a gate potential voltage during the light emission period.

16. The display device according to claim 15,
wherein a gate potential voltage during the reset period is higher than the gate potential voltage during the reverse-bias application period.

\* \* \* \* \*